(12) United States Patent
Elmer

(10) Patent No.: US 6,254,397 B1
(45) Date of Patent: Jul. 3, 2001

(54) ATTACHMENT DEVICE FOR A GLASS PANE AT A MOUNTING FIXED TO A STRUCTURE

(75) Inventor: Hubert Elmer, Thaur (AT)

(73) Assignee: Dorma GmbH + Co. KG, Ennepetal (DE)

( * ) Notice: Subject to any disclaimer, the term of this patent is extended or adjusted under 35 U.S.C. 154(b) by 0 days.

(21) Appl. No.: 09/498,385

(22) Filed: Feb. 3, 2000

Related U.S. Application Data

(63) Continuation-in-part of application No. PCT/EP99/03721, filed on May 28, 1999.

(30) Foreign Application Priority Data

| Jun. 4, 1998 | (AT) | 954/98 |
| Apr. 6, 1999 | (DE) | 199 15 193 |

(51) Int. Cl.⁷ .............................. H01R 41/00; E04B 2/88
(52) U.S. Cl. ................................ 439/6; 52/235; 52/506.05
(58) Field of Search ........................... 439/6; 52/171.1, 52/235, 506.05, 512

(56) References Cited

U.S. PATENT DOCUMENTS 5,540,514 * 7/1996 Demars et al. .

FOREIGN PATENT DOCUMENTS

| 3927653 | 3/1991 | (DE) . |
| 4400979 | 7/1995 | (DE) . |
| 4445724 | 6/1996 | (DE) . |
| 19519526 | 11/1996 | (DE) . |
| 19519527 | 11/1996 | (DE) . |
| 19528489 | 2/1997 | (DE) . |
| 296 17 870 U | 3/1998 | (DE) . |
| 0417303 | 3/1991 | (EP) . |
| 0784129 | 7/1997 | (EP) . |

OTHER PUBLICATIONS

Solon Catalog—Photovoltaik für das neue Jahrtausend.

* cited by examiner

*Primary Examiner*—Renee Luebke
*Assistant Examiner*—Briggitte Hammond
(74) *Attorney, Agent, or Firm*—Nils H. Ljungman & Associates

(57) ABSTRACT

An attachment device for a glass pane presenting voltaic cells, at a mounting fixed to a structure, whereby the glass pane is hold between two clamping elements. The invention concentrates on the fact that a coupling bell is supported with adjustable initial tension at the inside clamping element, while a permanently elastic spring member is placed between the coupling bell and the inside clamping element tolerating a relative motion of the coupling bell with regard to the clamping element. The invention concentrates furthermore on the execution of several spatial articulations and between the glass pane and the mounting fixed to a structure, as well as on the realization of the current conduction passing through the attachment device.

20 Claims, 28 Drawing Sheets

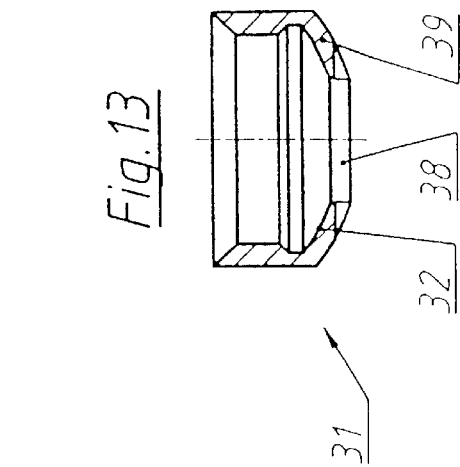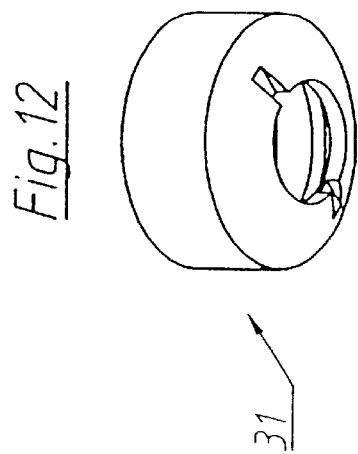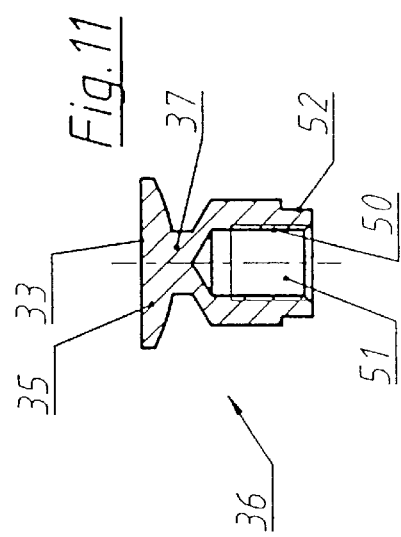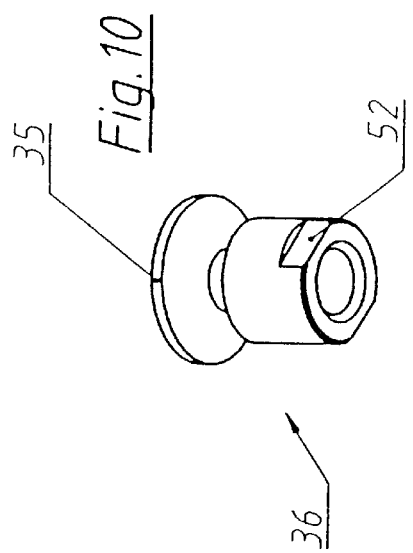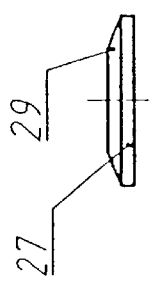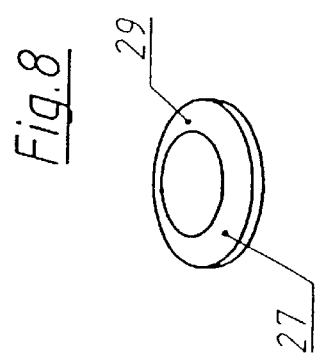

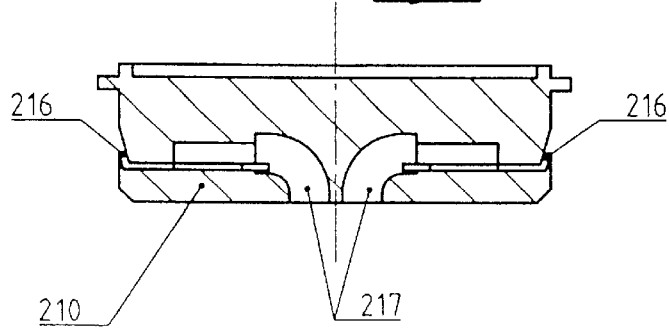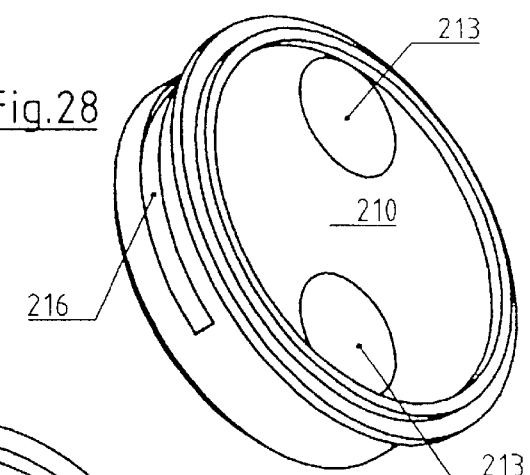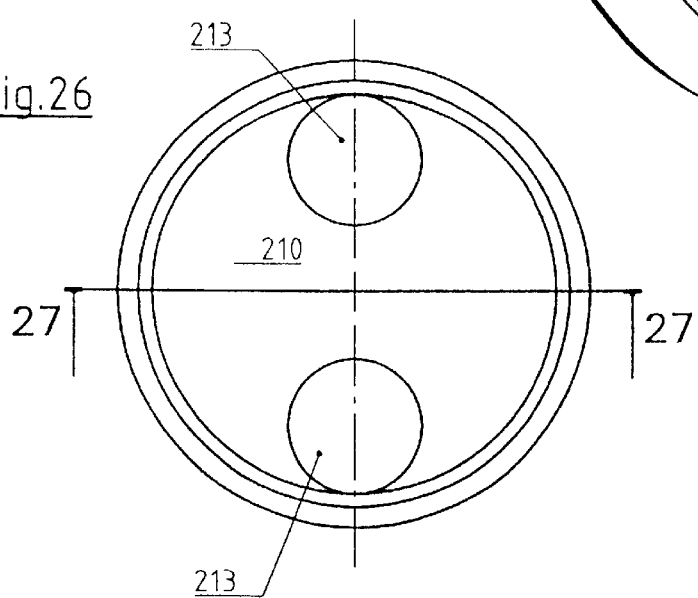

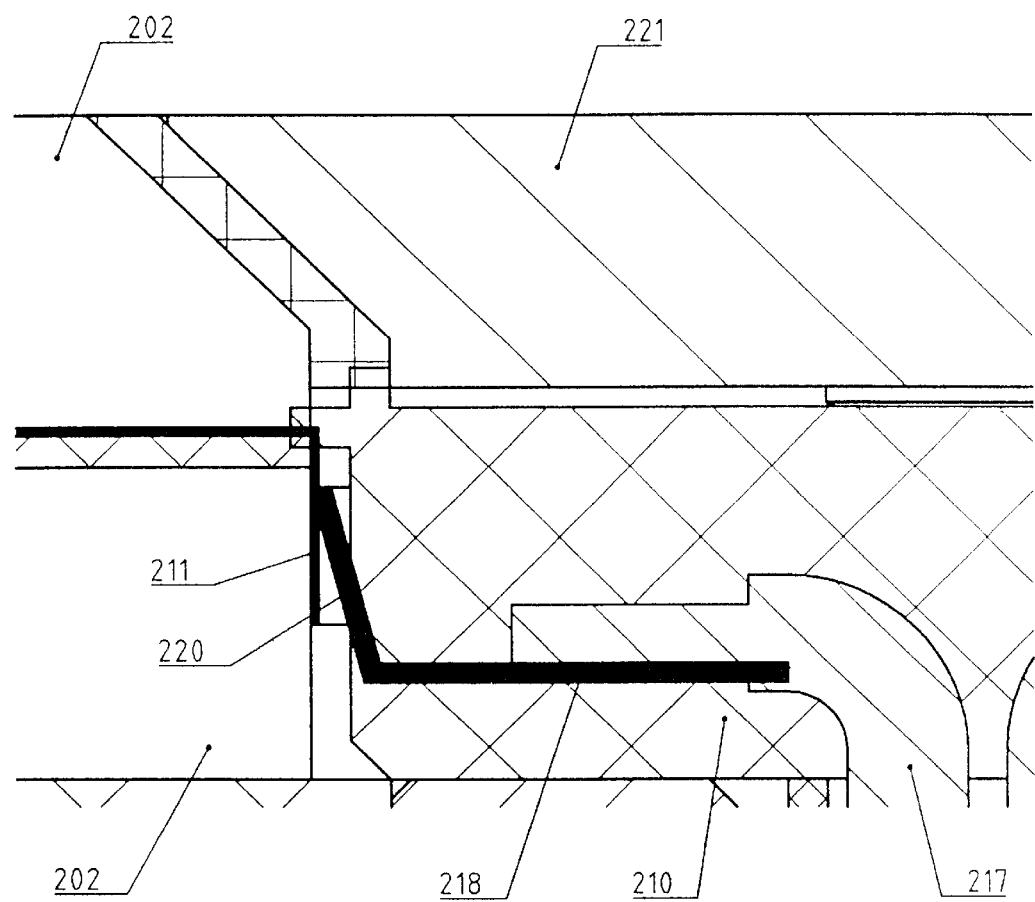

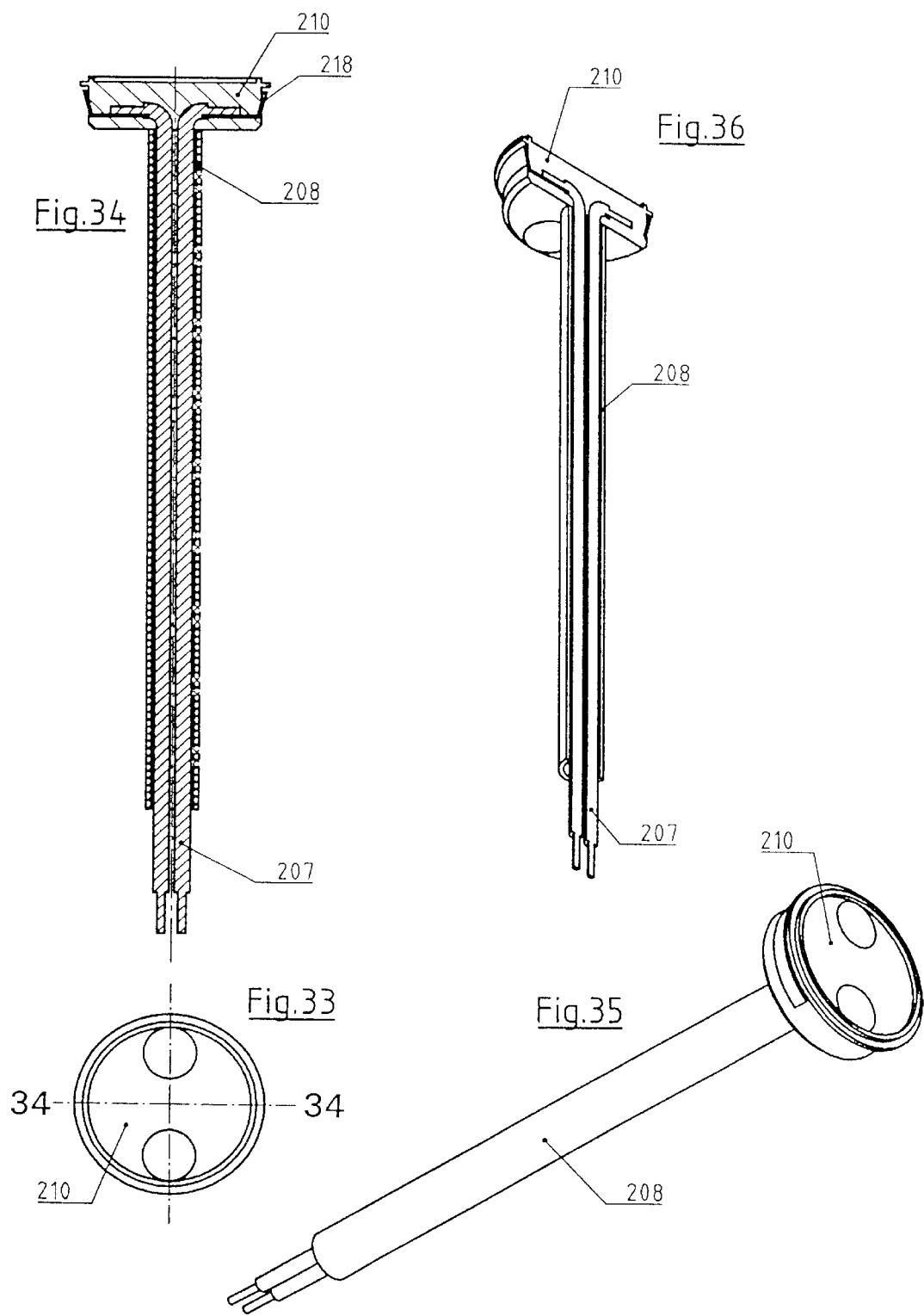

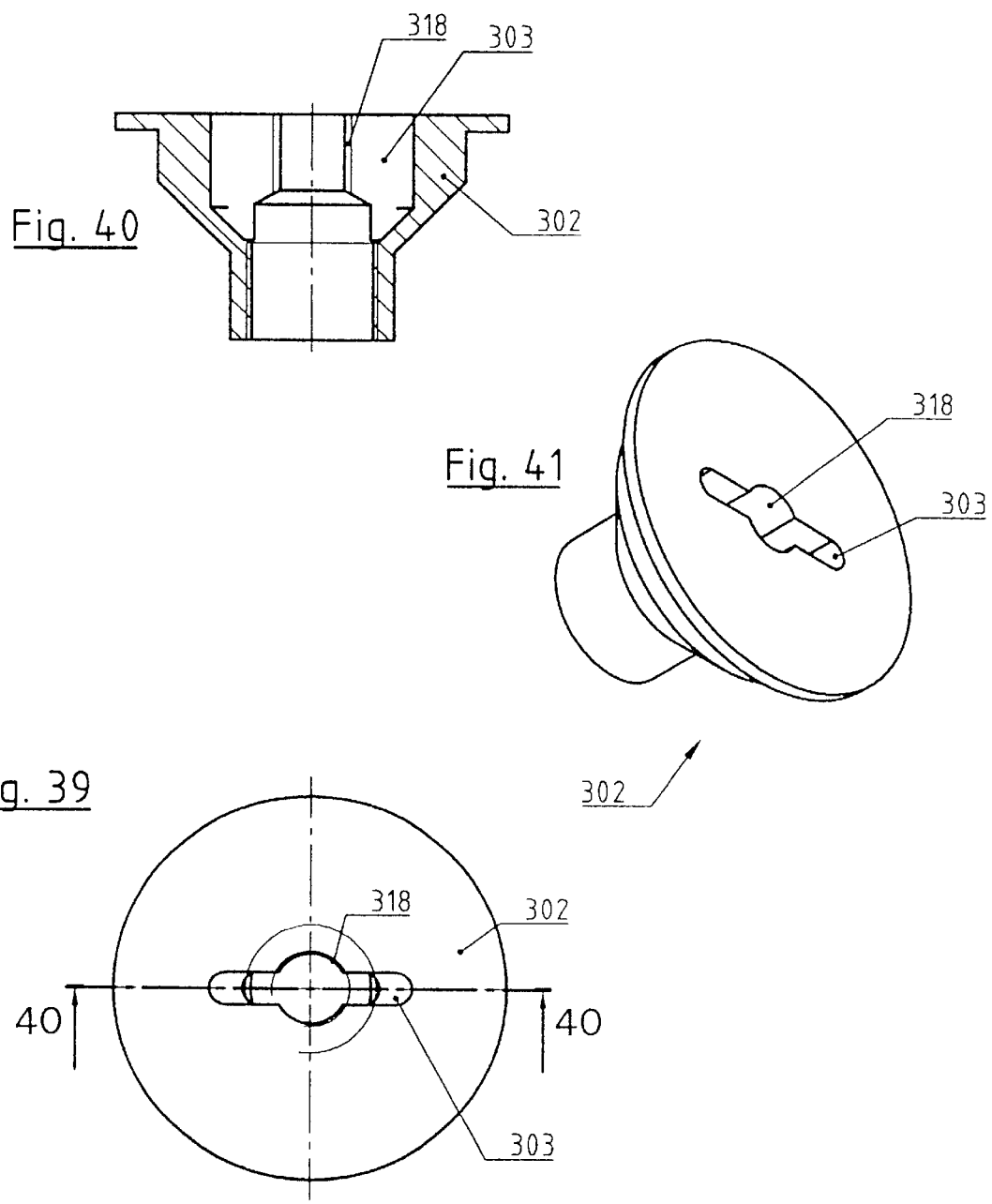

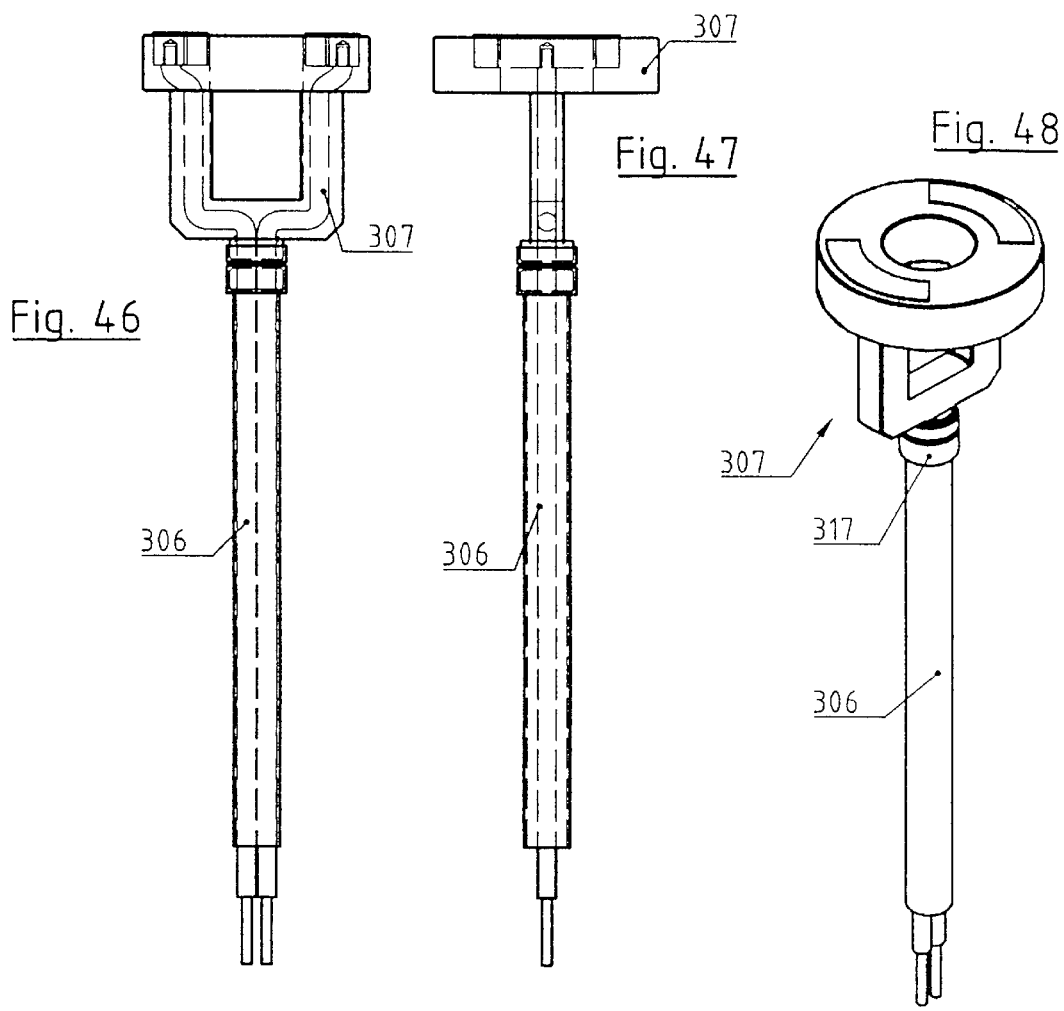
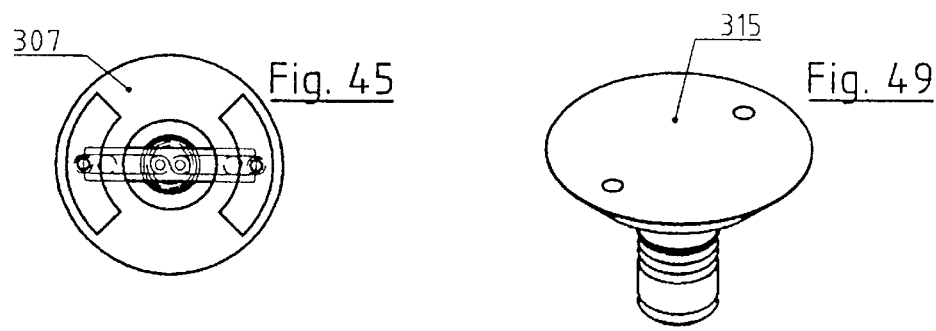

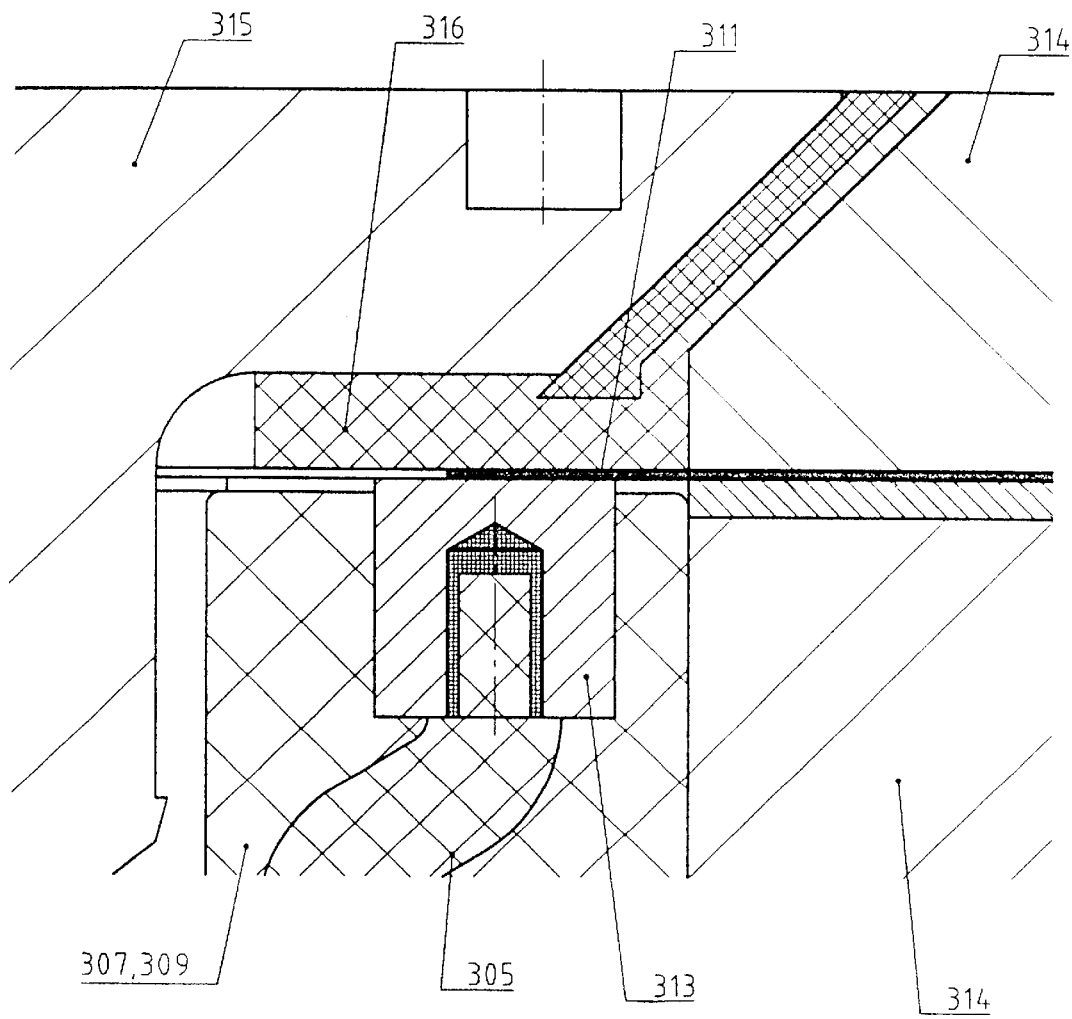

ATTACHMENT DEVICE FOR A GLASS PANE AT A MOUNTING FIXED TO A STRUCTURE

CONTINUING APPLICATION DATA

The present invention is a continuation-in-part of International Patent Application No. PCT/EP99/03721, filed May 28, 1999, in which the United States of America was a designated state and in which the United States of America remains a designated state as of the filing of the International Patent Application. International Application No. PCT/EP99/03721, was pending as of the filing date of this application.

BACKGROUND OF THE INVENTION

1. Field of the Invention:

The present invention relates to an attachment device for a glass pane, presenting at least one unifacial voltaic cell with wires conducting the current, at a mounting fixed to a structure with an outside and inside clamping element fixing the glass pane between them, and with a support for the attachment device at the inside clamping element.

2. Background Information:

German Patent No. 195 19 527 A reveals a spatial articulated support for an attachment device, where a girder connected to a mounting fixed to a structure is supported at a clamping element inside the structure. The support is realized by means of a girder mounting head flexibly, elastically supported in a clamping element's mounting chamber in the girder's axial direction, whereby the mounting head is supported in a mounting chamber with additional lateral play, tolerating that the girder, respectively its mounting head, parallel dislocates or can be moved in a parallel direction with regard to the glass pane's plane under the influence of wind pressure. The mounting head's elastic resilience is conceived by means of disc springs or permanently elastic material, which arrangement in the mounting chamber permanently exerts a restoring force on the girder, and therefore, respectively on the glass pane, as well as a positioning of the girder orthogonally with regard to the glass pane, and ultimately results in tension introduced into the glass pane. Moreover, important tolerances between the borehole in the glass pane and the point of connection at the mounting fixed to a structure can not be compensated.

German Patent No. 44 00 979 A1 also reveals a spatial articulated support, where the clamping element (locating bearing) inside the structure presents, at the envelope surface oriented towards the mounting, a ball-shaped surface on which leans a compensating part with a complementing spherical calotte surface. The clamping element is provided with a through borehole for the reception of the clamp screw coupling the clamping elements, and reception of a holding screw that penetrates a liner and the compensating part and engages into the clamping element. The known device can compensate for building tolerances between the borehole in a glass pane and a sub-construction (mounting)—a flexible elastic support for the glass pane at the mounting is not provided—once the assembly is finished.

German Patent No. 44 45 724 A1 describes a similar device, where a clamping element inside the structure presents a ball-shaped surface at its envelope surface oriented towards the mounting, and where a retaining part's pivoting bearing sits close to its complement surface, whereby the pivoting bearing is held with lateral play in a union nut. Once the assembly is finished, no relative motion of the glass pane is possible with regard to the retaining part.

Furthermore, a supporting element for a fastening bolt at a suspension device is published by EP 0 784 129 A1, where a plate of the suspension device is clamped between two planoconvex lenses, the flat surfaces of which indirectly abut against the plate, with one of the lenses being in abutment with its convex surface at a clamping element inside the structure, and the other lens being in indirect abutment with a nut receiving the fastening bolt.

The publication German Patent No. 296 178 70 U1 describes a solar facade panel also suitable for roof covering and comprising a facade element with integrated photovoltaic solar panel. For current conduction, each facade panel is equipped with contact points connectable to a common line.

The European Patent No. 0 417 303 A1 deals with a roof-mountable installation for solar power production, which conception includes an adaptation possibility to process tolerances of the roof or to thermal stress introduced into the roof, especially for bridging the roof ridge. Current drain is not the subject of the application; this is obviously realized by means of a line passing through the roof as usually done with solar cells.

When attaching highly sensible glass panes, for example in connection with silicium panes for photovoltaic power production, the before-mentioned attachment devices do not meet the requirements. Already low wind pressure and respectively relatively inferior deformations due to thermal development will lead to the breaking of the silicium elements and to the loss of the proper purpose of the glass pane.

OBJECT OF THE INVENTION

The object of the present invention is to improve an attachment device of the before-mentioned species so that on the one hand a stress-free adaptation of the attachment device is possible, taking into account major building tolerances during assembly, and that on the other hand, once the assembly is realized, between the attachment device and the glass pane sufficient elasticity is given, so that wind pressure or thermal stress is absorbed by the attachment device without introducing stress into the glass pane.

Another object of the present invention is to provide an essentially optimum conduction of electric current for a glazing structure at least partially built with glass panes including voltaic cells.

SUMMARY OF THE INVENTION

The object of the present invention can be achieved in an attachment device for a glass pane, including at least one unifacial voltaic cell with wires conducting the current, at a mounting fixed to a structure with one outside and one inside clamping element fastening the glass pane between them and a support of the attachment device at the inside clamping element.

Accordingly, an inside clamping element presents, after its envelope surface opposite to the glass pane, a conical or crowned surface built by a permanently elastic spring member surface against which the complement surface of an internal coupling bell's envelope can be adjustable with variable initial tension. Between the coupling bell and an attachment bolt on the one hand, and an attachment bolt and a mounting on the other hand, respectively one stiffening spatial articulation can be arranged and the current conducting lines pass through the attachment device.

According to the inventional solution, wind pressure and thermal stress can be absorbed by the coupling bell's elastic support at the interior clamping element, as also once the assembly is completed, a relative motion of both parts towards each other is thereby possible without introducing restoring forces into the glass pane. This can be essentially guaranteed thanks to the adjustable initial tension between the clamping element and the coupling bell. The repeated partitioning of the attachment device into at least two more spatial articulations may not only provide an advantageous adaptation possibility to major building tolerances, but, once rigidly tightened after the assembly is completed, the individual articulated points of the spatial articulation also form so-called system points having a certain self-elasticity, additionally contributing to the essentially stress-free suspension of the glass pane.

In this case, the attachment device per forms a double function, as the current is conducted through the attachment device, essentially no special collector components are required.

Further features of the present invention are discussed herein below.

With regard to one inventional embodiment, on its envelope surface opposite to the glass pane, the interior clamping element itself can present a conical or crowned surface, basically according to the attachment device for a glass pane, the conical or crowned surface can be formed by the permanently elastic spring member, even though the clamping element has a planar execution. Furthermore, the inside clamping element can be provided with a through borehole with female thread and centering for the reception of a clamp screw linking the clamping elements and a coupling bell regulating screw linking the coupling bell with the inside clamping element. In a further possible execution of the invention the permanently elastic spring member can be realized as an essentially permanently elastic cushion arranged between the conical or crowned surface of the inside clamping element oriented towards the glass pane and the coupling bell's complement surface. The essentially permanently elastic cushion can be fastened by means of the before-described coupling bell regulating screw in a way that not only the permanently elastic cushion itself absorbs stress introduced into the glass pane, but tolerates the coupling bell's relative displacement with regard to the permanently elastic cushion with the result that the glass pane is suspended essentially completely stress-free.

According to one special inventional feature, the coupling bell shows on its side oriented towards the mounting a cylindrical male threaded extension, between which and the coupling bell in the area of the coupling bell's bottom is conformed an inward oriented flange for the support of the coupling bell's regulating screw head. Thus, due to the play provided between the flange and the coupling bell regulating screw's shaft, it is possible to conceive the arrangement of a lens, in fact, in the form of a disc between the flange and the coupling bell regulating screw's head such that the coupling bell regulating screw's shaft can oscillate with regard to the coupling bell. This oscillation is encouraged if the flange's locating face and the lens' complement surface are conceived conically or crowned. In this case, it has been advantageous to employ a non-metallic lens, for example made of gliding hard rubber. By doing so, in fact an additional spatial articulation has been achieved between the coupling bell and the inside clamping element and therefore the glass pane.

Yet another spatial articulation can consist in the fact that the coupling bell extension's fore-part oriented against the mounting can be curved like a concave lens, whereby a pot-formed union nut, overlapping the coupling bell extension's male thread, can display an inner pot bottom area curved correspondingly opposite to the coupling bell extension's forepart, in a way that between the coupling bell extension's forepart and the union nut's pot-bottom, two convex lenses can be positioned, whereby their flat surfaces can be in abutment. Once the assembly is completed, the before-described union nut is able to stiffen the spatial articulation.

In one advantageous inventional embodiment the planoconvex lens sitting close to the union nut's pot-bottom area can form part of a nut receiving the attachment bolt offering the possibility to screw the attachment bolt more or less into the nut with the intention to realize a reduction or extension of the whole attachment device. In order to realize said spatial articulation, the nut's shaft can be dimensioned such as to pass with play through a borehole in the union nut's pot-bottom.

Yet another spatial articulation can be achieved in the aforementioned manner in the area of the direct connection of the attachment bolt with the mounting, in that the attachment bolt passes with play through a borehole in the mounting and the mounting is tightened between a nut and a counter-nut, whereby between the nut and the counter-nut on the one hand and the mounting on the other hand is provided respectively one planoconvex lens abutting with its flat surface against the mounting and the nut and the counter-nut display complementary surfaces with regard to the lens. Here again, it is a question of an adjustable and adaptable spatial articulation during assembly, and, once the assembly is completed, a stiffening spatial articulation, whereby a distance sleeve may be used between the last described spatial articulation which builds the connection to the mounting and the spatial articulation built by the coupling bell and the union nut.

The execution of the clamping element outside the structure fixing the glass pane, can be fundamentally arbitrary; it may be conceived as an already known clamping disc or counter-sunk screw without having any influence on the practically stress-free attachment of the glass pane, thanks to the invention.

According to the invention, the wires of at least one voltaic cell conducting the current can pass through the attachment device.

Advantageously, it can be provided for that the attachment device comprises two coupling, preferably screwable, holding discs between which the glass pane is held, whereby the current conduction can radially enter between the holding discs and axially exit at one holding disc. In order that the wires for the current conduction pass without any problem through the glass pane holder, in one inventional embodiment, the holding discs can be screwed by means of separate screws, preferably arranged in the area of cylindrical extensions. Advantageously, the wires inside the glass pane can be made of flat metal strands, which in the area of the holding disc, can be connected to round wire or standard wire by means of connector assemblies. The current is conducted to the building via the round or standard wires. To prevent the wires in the connector area from oxidation, in the inventional embodiment the aperture can be filled in with non-conductive synthetic material, such as wax or the like, and the wires are embedded in this material. Advantageously, the synthetic material can be polyurethane.

In further execution of the invention, it is conceivable that an attachment device with the structural characteristics of the preferred embodiment of the present invention can present a coupling bell regulating screw and a floating screw that is fastened by the union nut and connectable with the attachment bolt, presenting respectively a through borehole with centering, namely for the reception of a flexible tube receiving the line conducting the current.

An insulator can, in this case, be advantageously mounted in a hole type aperture in the glass pane, wherein the wires of the voltaic cells are combined with the sheathed flexible cables. The insulator can display two through boreholes for the penetration of screws connecting the glass pane with the clamping element inside the structure, whereby at least two radial slot openings and thereto connected axial guiding channels are provided for the connection of the current carrying lines. According to another inventional characteristic, in the radial slot openings can be positioned springy elastic contact pieces having a leg that contacts the voltaic cells' wires. The insulator can be fixed by means of clamp screws in the glass pane's hole-type aperture between the clamping element inside the structure and a cone nut.

In another execution example with the aforementioned preferred structural characteristics, the clamping element inside the structure shows an axial opening for the essentially torsion-resistant reception of an insulating cage serving to electrically connect the voltaic cells with the lines of a flexible tubing passing through the clamping element inside the structure.

The above discussed embodiments of the present invention will be described further herein below with reference to the accompanying Figures. When the word "invention" is used in this specification, the word "invention" includes "inventions", that is, the plural of "invention". By stating "invention", the Applicants do not in any way admit that the present application does not include more than one patentably and non-obviously distinct invention, and maintains that this application may include more than one patentably and non-obviously distinct invention. The Applicants hereby assert that the disclosure of this application may include more than one invention, and, in the event that there is more than one invention, that these inventions may be patentable and non-obvious one with respect to the other.

BRIEF DESCRIPTION OF THE DRAWINGS

Hereinafter the present invention is explained in more detail on the basis of different embodiment examples. FIGS. 1 to 13 diagrammatically represent the attachment device's stress-free adaptation, not showing the current conduction. It shows:

FIG. 1 is a cross-sectional view of an attachment device.

FIG. 2 is the cross-sectional view according to FIG. 1, the glass pane being inclined with regard to the mounting.

FIG. 3 is the cross-sectional view according to FIG. 1 with modified outside clamping element.

FIGS. 4–13 show details of the interior clamping element, of the coupling bell, of the lens abutting against the screw bell of the coupling bell regulating screw, of the nut receiving the attachment bolt and of the union nut, respectively in perspective and cross-sectional view.

FIG. 4 is a perspective view of a clamping element.

FIG. 5 is a cross-sectional view of the clamping element of FIG. 4.

FIG. 6 is a perspective view of a coupling bell.

FIG. 7 is a cross-sectional view of the coupling bell of FIG. 6.

FIG. 8 is a perspective view of a lens.

FIG. 9 is a lateral view of the lens of FIG. 8.

FIG. 10 is a perspective view of a nut.

FIG. 11 is a cross-sectional view of the nut of FIG. 10.

FIG. 12 is a perspective view of a union nut.

FIG. 13 is a cross-sectional view of the union nut of FIG. 12.

FIG. 14 is a lateral view of an inventional attachment device.

FIG. 15 is a top view of the exterior holding disc of the attachment fitting.

FIG. 16 is a sectional view taken along line 16—16 of FIG. 15.

FIG. 17 is a sectional view taken along line 17—17 of FIG. 16.

FIG. 18 is a lateral view of a cover.

FIG. 19 is an axial sectional view of an attachment bolt.

FIG. 20 is a sectional view analogous to FIG. 16 according to another inventional embodiment.

FIG. 21 is a sectional view taken along line 21—21 according to FIG. 20.

FIG. 22 is a top view of the inventional glass pane.

FIGS. 23 to 46 illustrate one embodiment of the stress free attachment device's adaptation while using the essential components of the embodiment according to FIG. 1 with a passage for the current conducting wires through the attachment device.

FIG. 23 is a vertical sectional perspective view of the attachment device.

FIG. 24 is a vertical sectional view represented offset by 90 degrees with regard to FIG. 23.

FIG. 25 is a vertical sectional view according to FIG. 23.

FIG. 26 is an enlarged top view on the insulator.

FIG. 27 is a sectional view taken along line 27—27 according to FIG. 26.

FIG. 28 is a perspective view of the insulator.

FIG. 29 is an enlarged detailed representation of, the current drain.

FIG. 30 is an enlarged top view of the contact piece.

FIG. 31 is a lateral view of the contact piece.

FIG. 32 is a perspective view of the contact piece.

FIG. 33 is a top view of the insulator according to FIG. 26.

FIG. 34 is a sectional view taken along line 34—34 according to FIG. 33.

FIG. 35 is a perspective view of the insulator with connected shrinkdown tubing.

FIG. 36 is a perspective vertical sectional view of the insulator with connected shrinkdown tubing.

FIGS. 37 to 53 represent another embodiment of the attachment device's stress-free adaptation while using the essential components of the embodiment example according to FIG. 1 with another execution of a passage for the current conducting wires through the attachment device.

FIG. 37 is a vertical sectional view of the attachment device in perspective representation.

FIG. 38 is a vertical sectional view according to FIG. 37.

FIG. 39 is a top view of the clamping element inside the structure.

FIG. 40 is a sectional view taken along line 40—40 according to FIG. 39.

FIG. 41 is a perspective representation of the clamping element inside the structure.

FIG. 42 is a top view of the cage.

FIG. 43 is a sectional view taken along line 43—43 according to FIG. 42.

FIG. 44 is a perspective view of the cage.

FIG. 45 is a top view of the cage with connected shrinkdown tubing.

FIGS. 46–47 are two views of the cage construction unit.

FIG. 48 is a perspective representation of the cage with shrinkdown tubing.

FIG. 49 is a perspective representation of the clamp screw.

FIGS. 50–51 are two views of the contact piece.

FIG. 52 is a perspective representation of the contact piece.

FIG. 53 is a detail of the current passage.

DESCRIPTION OF THE PREFERRED EMBODIMENT

Figure 1:
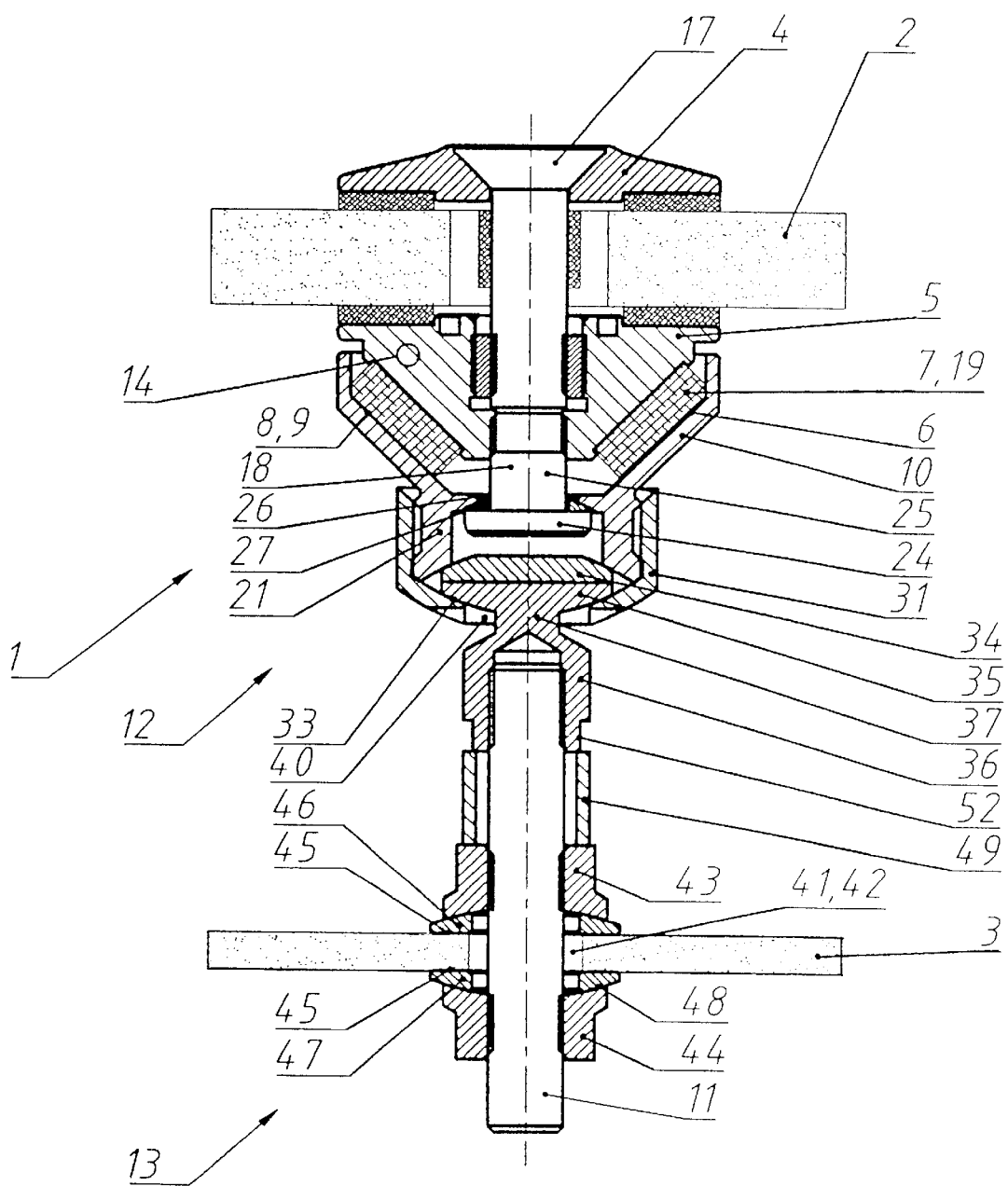
Figure 2:
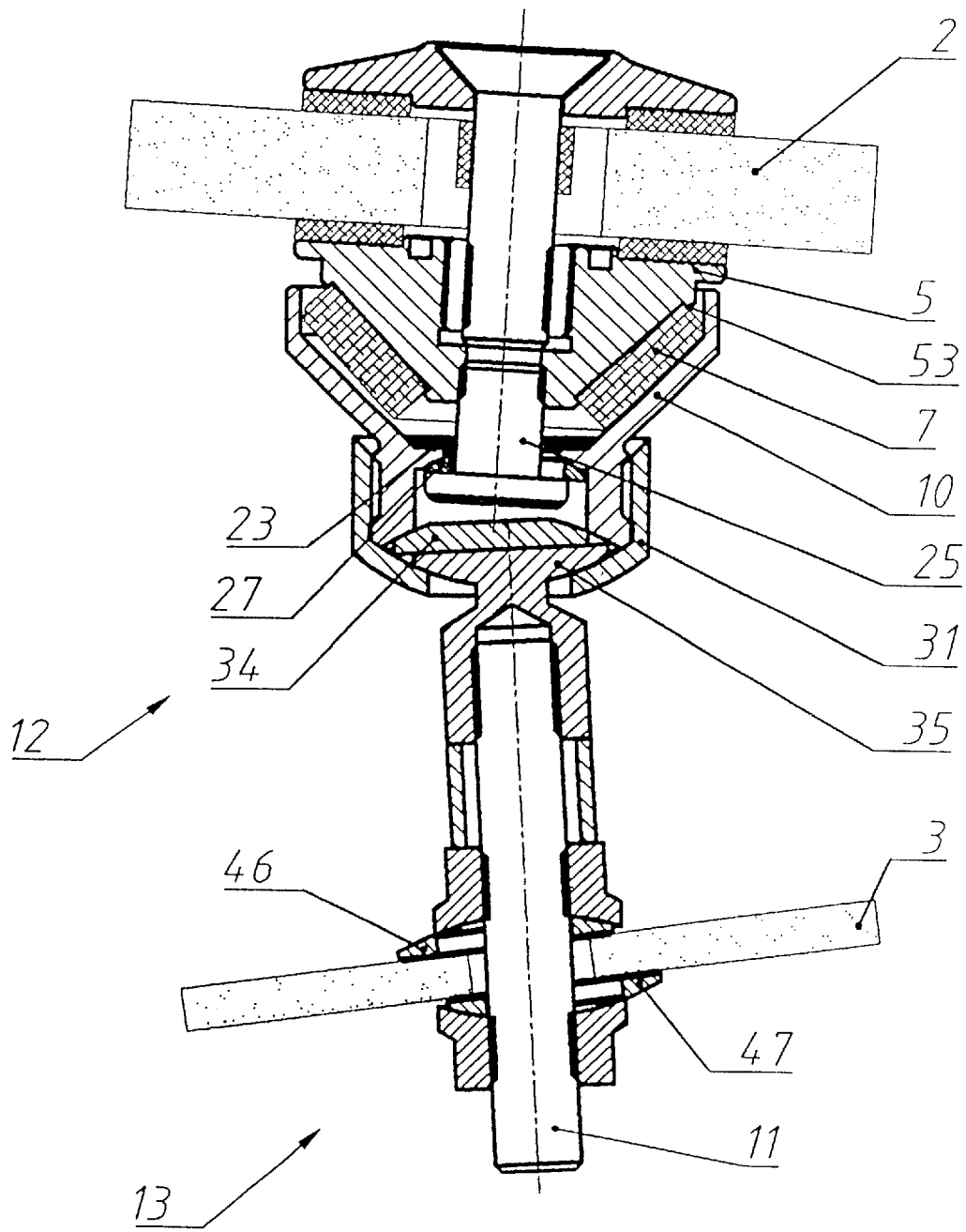
Figure 4:
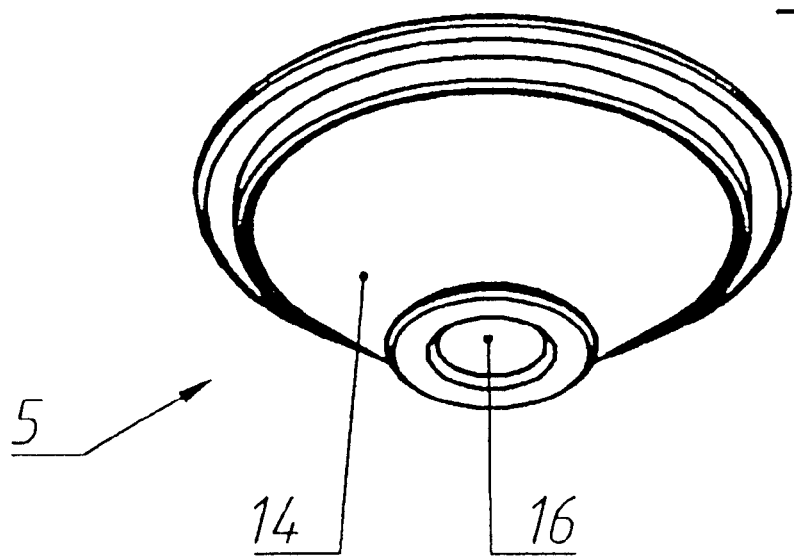
Figure 5:
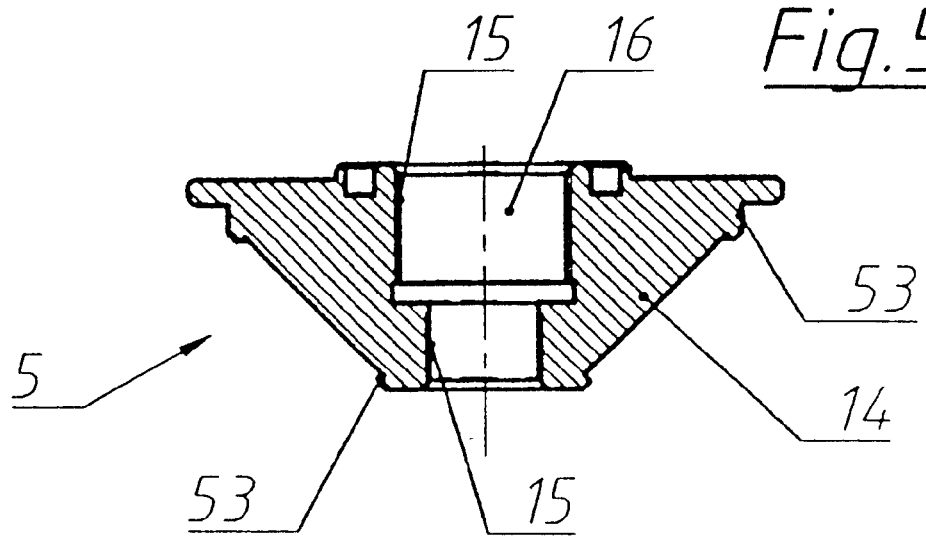
Figure 6:
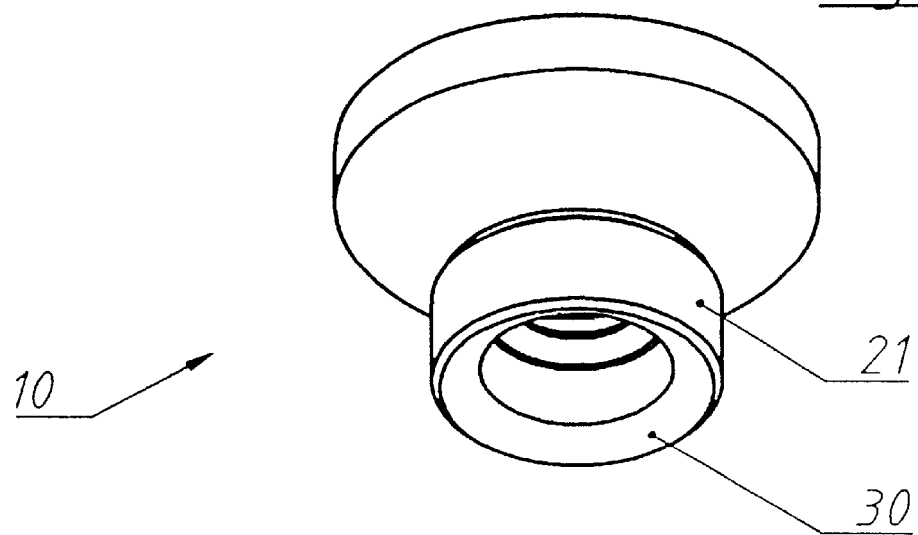
Figure 7:
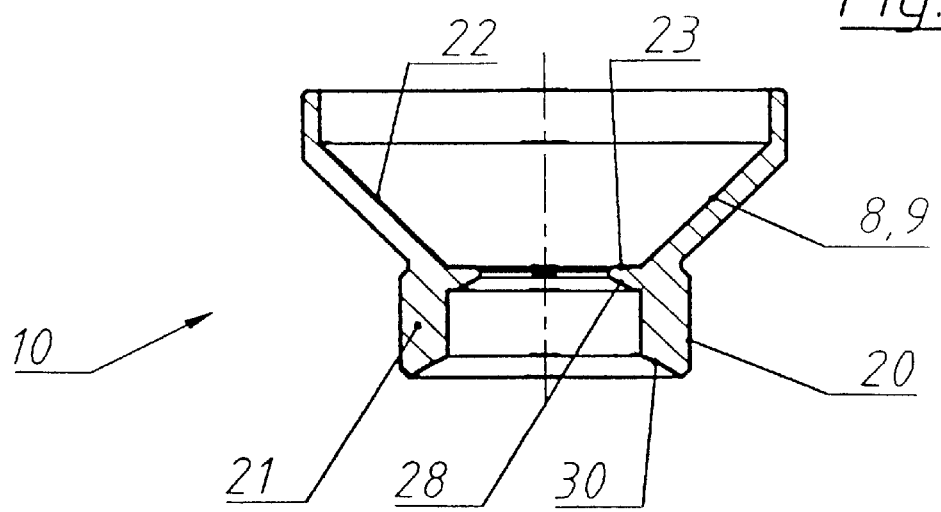

An attachment device 1 according to FIG. 1 includes two clamping elements 4 and 5 between which a glass pane 2 is fastened. The glass protection installed in a well-known way and visible in the drawing is not specified in detail. In the embodiment example, the inside clamping element 5 comprises a conical envelope surface 14 to which is annexed a permanently elastic spring member executed as permanently elastic cushion 19 propping up on a projection 531 thus the spring member practically builds the clamping element's 5 proper envelope surface 6. A coupling bell's 10 inner envelope 9 with a complement surface 8 adjoins this envelope surface 6. The coupling bell 10 is shown in greater detail in FIGS. 6 and 7. A clamp screw 17 extends through a through borehole 16 (cf. FIGS. 4 and 5) of the clamping element 5 and links both clamping elements 4 and 5. For this purpose, the through borehole 16 presents a female thread 15. A coupling bell regulating screw 18 engages into the same female thread 15 which screw head 24 leans on a flange 23 of the coupling bell's 10 cylindrical extension 21. A preferably elastic lens 27 as shown in FIGS. 8 and 9 is provided between the flange 23 and the screw head 24, which lens leans on a flange's 23 locating face 28, in a way that at this place a spatial articulation is realized within the limits of a play 26, as shown in FIG. 2. For this purpose, the lens 27 is equipped with a complement surface 29. As is shown in FIGS. 7 and 9, the locating face 28 of flange 23 and the complement surface of lens 27 are both crowned so as to reduce the area of contact between them. The coupling bell's 10 cylindrical extension 21 beginning in the area of the bottom 22 presents a concave-curved fore part 30 oriented towards the mounting 3. The inner pot-bottom area 32 of a union nut 31 which is shown in greater detail in FIGS. 12 and 13, has got a correspondingly opposite curvature, so that two lenses 34 and 35 can be arranged between the extension's 21 fore-part 30 and a union nut's 31 pot-bottom 39, which lenses' flat surfaces 33 abut and the one loose lens 34 adjoins with its convex surface the extension's 21 fore-part 30, whereas the second lens 35 forms an integrated part of a nut 36 which is shown in greater detail in FIGS. 10 and 11, receiving the attachment bolt 11 and its convex surface leans on the pot-bottom 39. The nut 36 is provided with a shaft 37 extending with play 40 through a borehole 38 in the union nut 31.

FIG. 1 illustrates the situation that, when screwing the union nut 31 on the coupling bell 10 by means of an exterior thread 20 in the area of the extension 21, a generally with 12 specified spatial articulation built by both lenses 34 and 35 can be stiffened. In other words, the spatial articulation 12 of lenses 34 and 35 is stiffened when the union nut 31 is screwed further onto coupling bell 10. The nut 36 (cf. FIGS. 10 and 11) has got a pocket borehole 51 with a female thread 50 into which the attachment bolt 11 can be screwed, whereby wrench areas 52 area included on the exterior envelope of the nut 36. In other words, wrench areas 52 are provided on the exterior of nut 36 in proximity to the female thread on the interior of nut 36. FIG. 1 shows furthermore that in this embodiment, a distance sleeve 49 is annexed to the nut 36, which sleeve itself leans on a nut 43 fastening the mounting 3. Between the nut 43 and a counter nut 44 are provided lenses 46 and 47 abutting against complement locating faces 48 of the nut 43 respectively the counter nut 44. The lenses' 46 and 47 flat surfaces 45 directly adjoin the mounting 3. As an attachment bolt 11 extends with play 42 through a mounting's 3 borehole 41, here again is realized a spatial articulation specified with 13, which is able to compensate building tolerances.

FIG. 2 illustrates the possible inclination of the glass pane 2 with regard to the mounting 3, with correspondingly adjusted spatial articulations 12 and 13 and correspondingly angled in the area of the coupling bell regulating screw's 18 shaft 25 on the one hand with regard to the coupling bell 10 and on the other hand with regard to the union nut 31. It is visible that a coupling bell's 10 displacement with regard to a permanently elastic spring member 7 has taken place. That means, here a non-stiffening spatial articulation has been realized. The permanently elastic spring member's 7 position is unchanged with regard to the clamping element 5 due to leaning on the projections 53.

Figure 3:
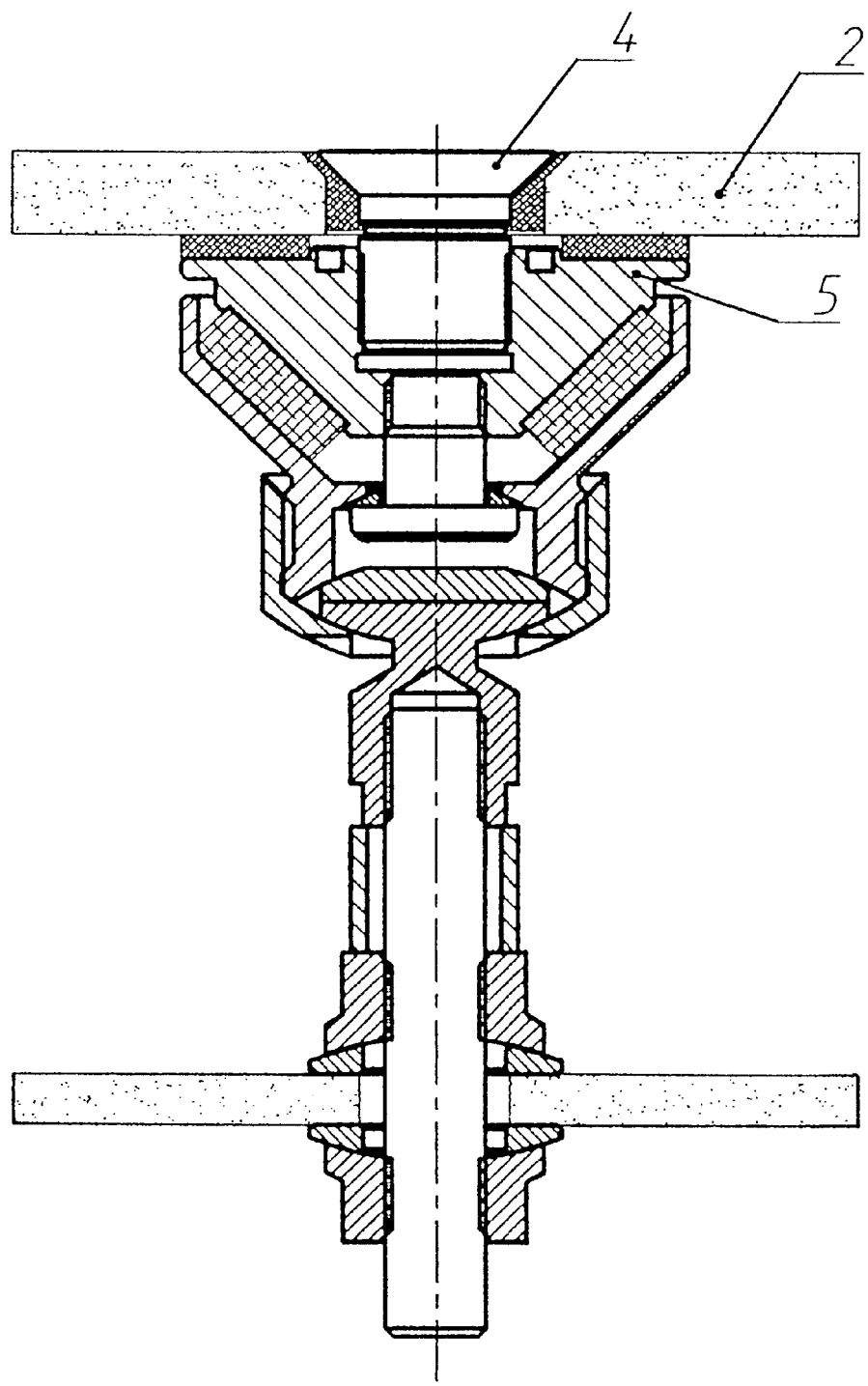

The embodiment example according to FIG. 3 corresponds in its essential components to the embodiment example according to FIG. 1, whereby in contrast to FIG. 1 the outside clamping element 4 is executed as countersunk screw.

As is hereinafter described in more detail, the embodiment according to FIG. 3 may be adapted for the passage of current conducting wires as shown in FIGS. 37 to 53. In this embodiment the attachment device 301 is provided with a clamping element 302 inside the structure, which is executed with an axial opening 303 into which a clamp screw 315 engages, thereby clamping the glass in the same manner as clamping element 4 in FIG. 3. The axial opening is slot-type executed as to torsion-resistingly place a fork-like section 310 of the insulating cage 307 in the slot aperture. Another annular section of the insulating cage 307 is held in a hole-type opening of the glass pane and presents grooves 312 oriented towards the wires 311 of the voltaic cells 304, in which grooves are positioned—preferably spring loaded—contact pieces 313 connected with the wires 305 of a flexible tubing 306. The insulating cage 307 is fastened between a clamp screw 315 that fixes the glass pane and the clamping element 302 inside the structure, whereby an insulating ring 316 is provided between the clamp screw and the contact pieces respectively the wires 311 of the voltaic cells 304. The flexible tubing stretches, as already described, through the clamping element inside the structure and through the floating nut, whereby, preferably in the area of the mounting fixed to the structure, another stiffening spatial articulation is conceived through which passes the flexible tubing.

According to the invention, glass panes 101 are generally mounted on framework as glazed facades to a building front wall.

Figure 20:
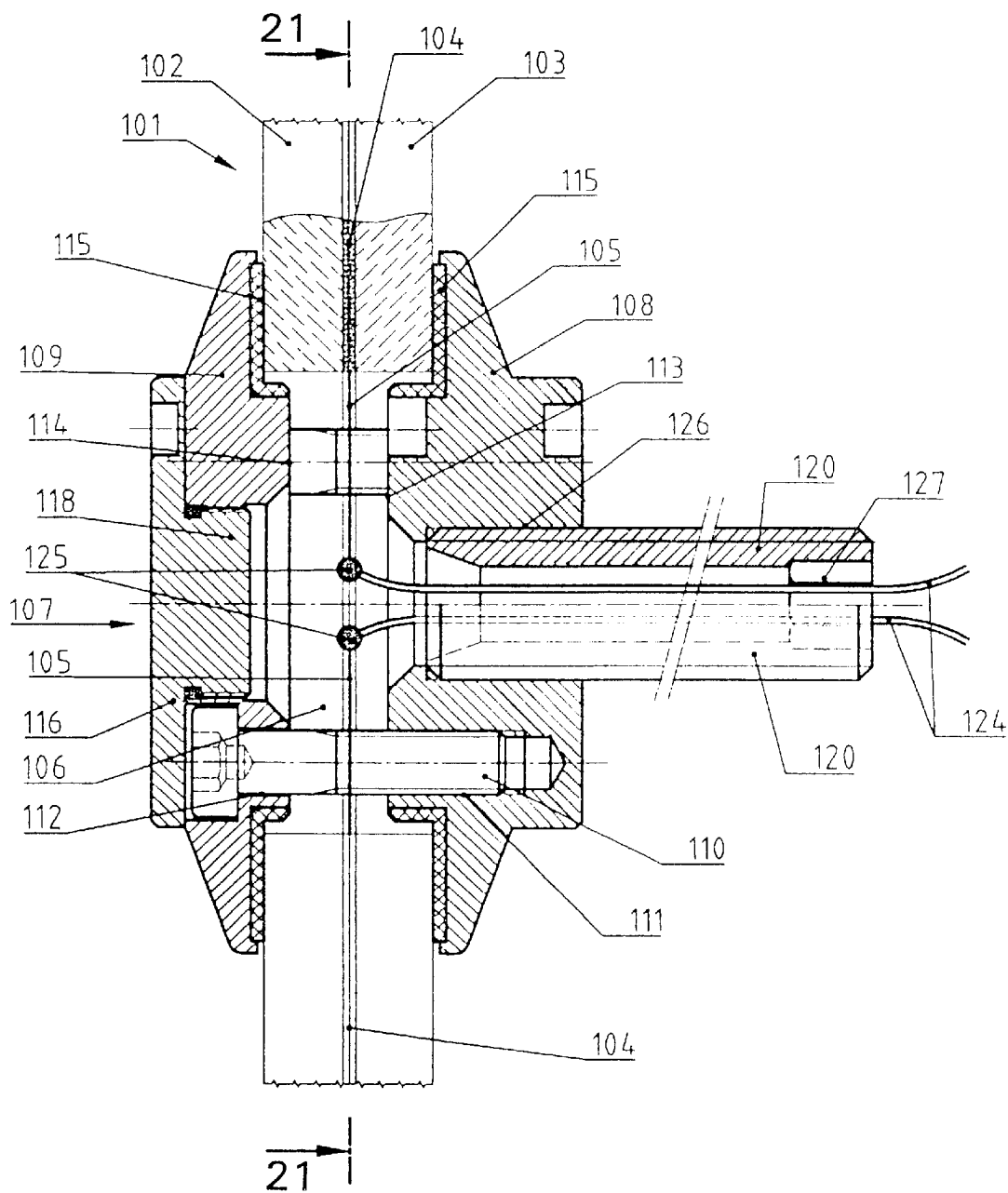
Figure 21:
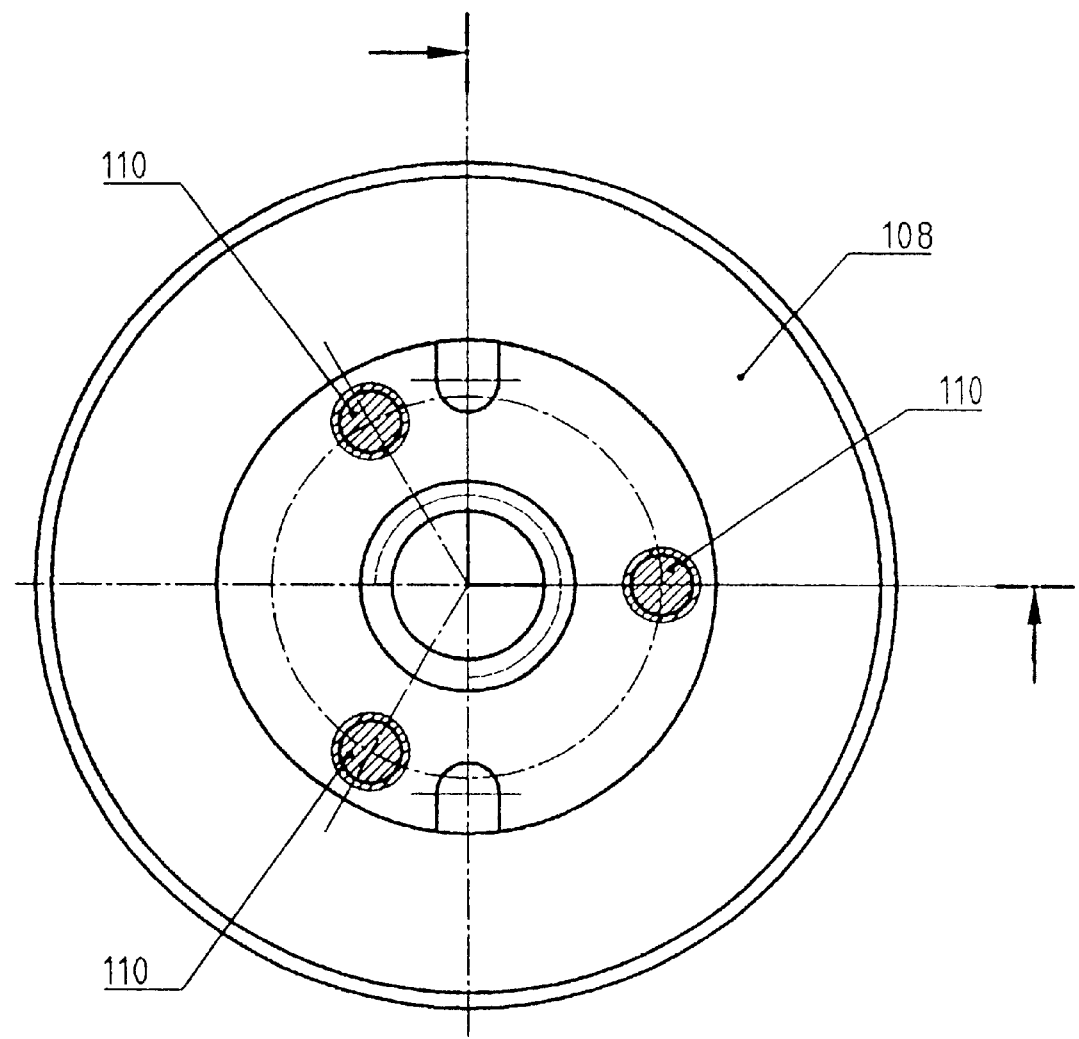
Figure 22:
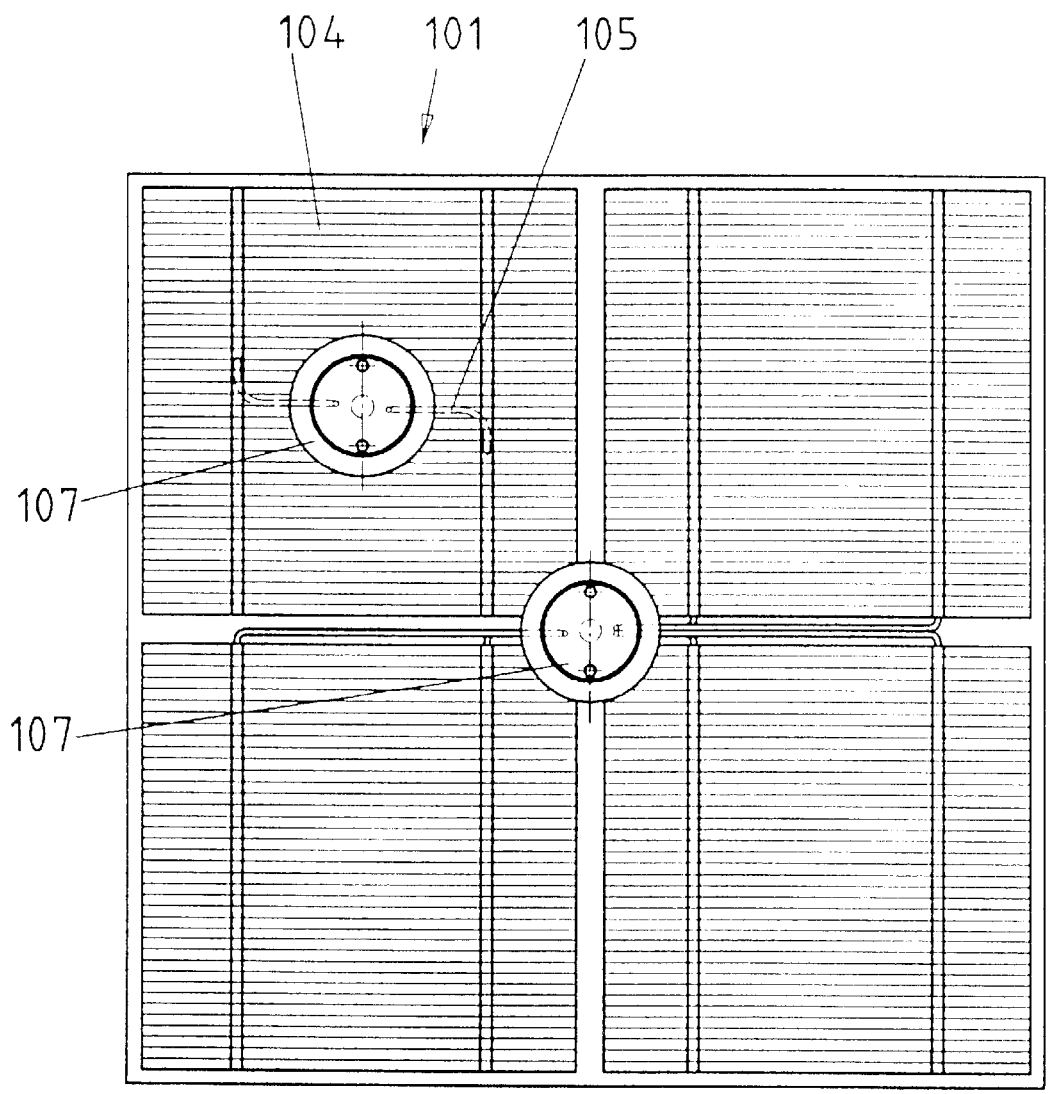
Figure 23:
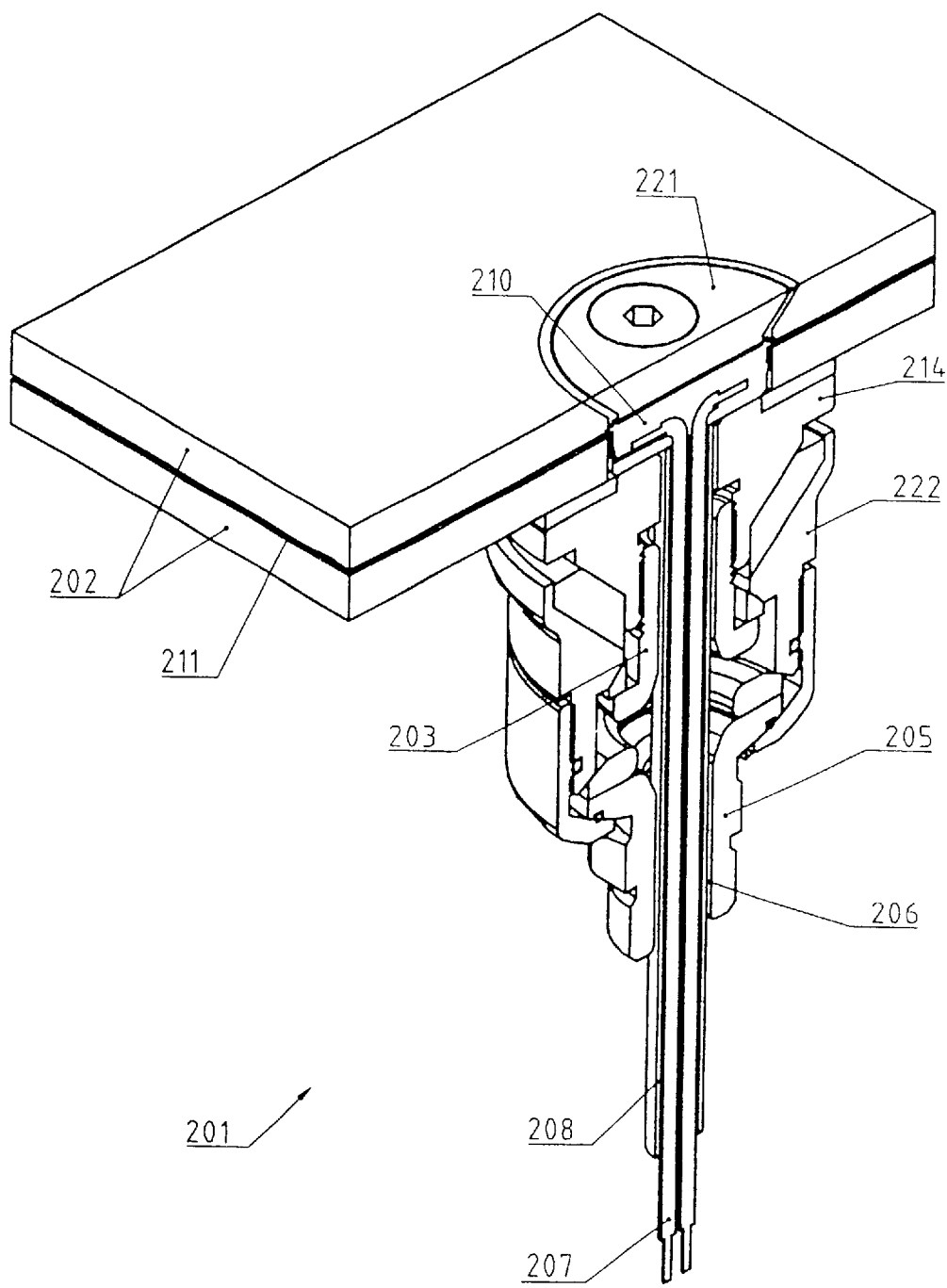
Figure 24:
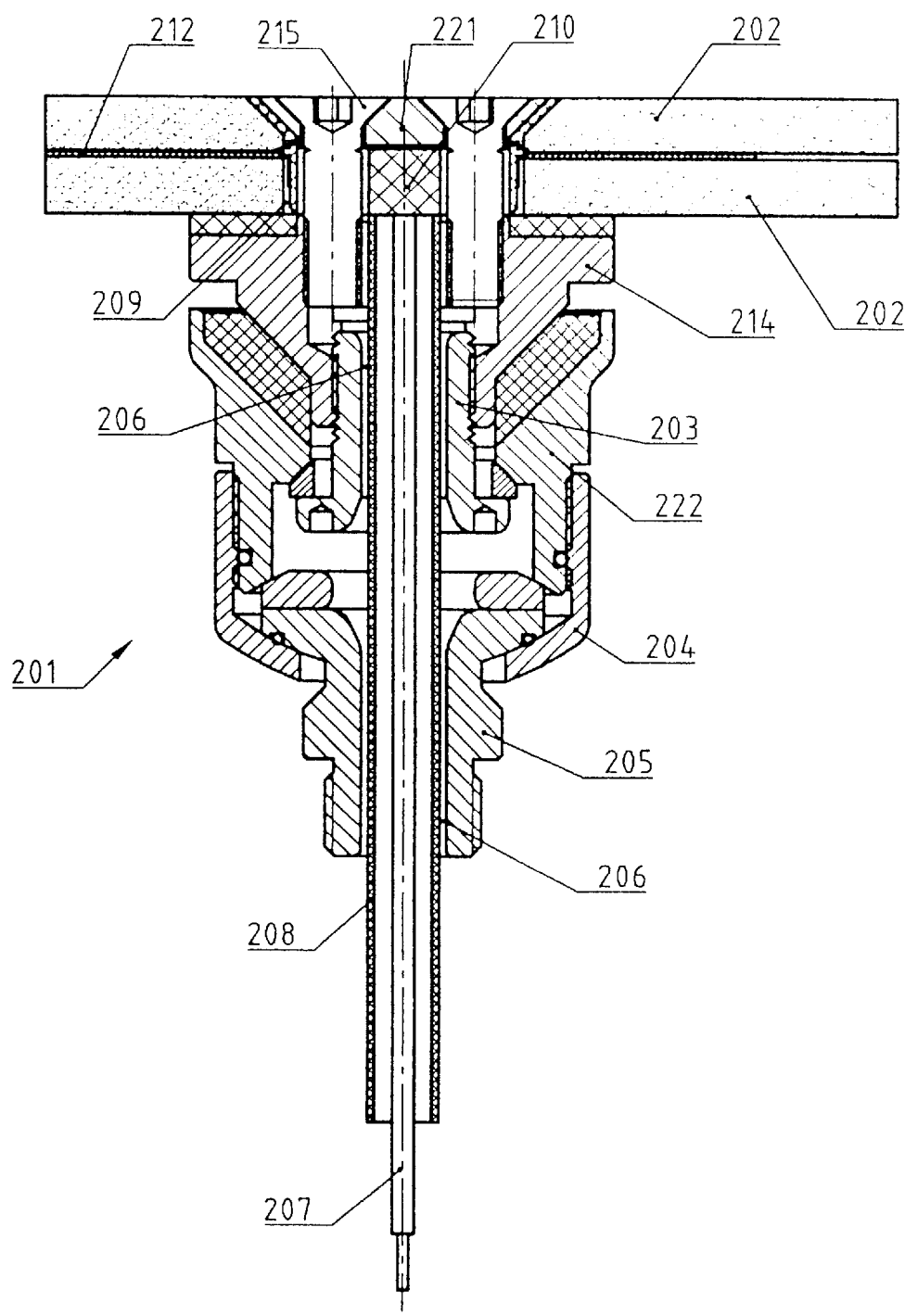

FIGS. 20 and 21 show the current conduction of another embodiment of the invention. The glass pane 101, according to the invention in the embodiment shown, includes two individual panes 102, 103 glued together comprising between them several voltaic cells 104 (see FIG. 22). In other words, several voltaic cells 104 are located between the individual panes 102 and 103 and are thus contained by them. The voltaic cells 104 are equipped with wires respectively connected to wires, through which the current from the voltaic cells 104 is conducted. In other words, current flows from the voltaic cells 104 through wires 105 to the wires of cables 124. In the embodiment example, the wires are made from flat metal strands 105.

Figure 14:
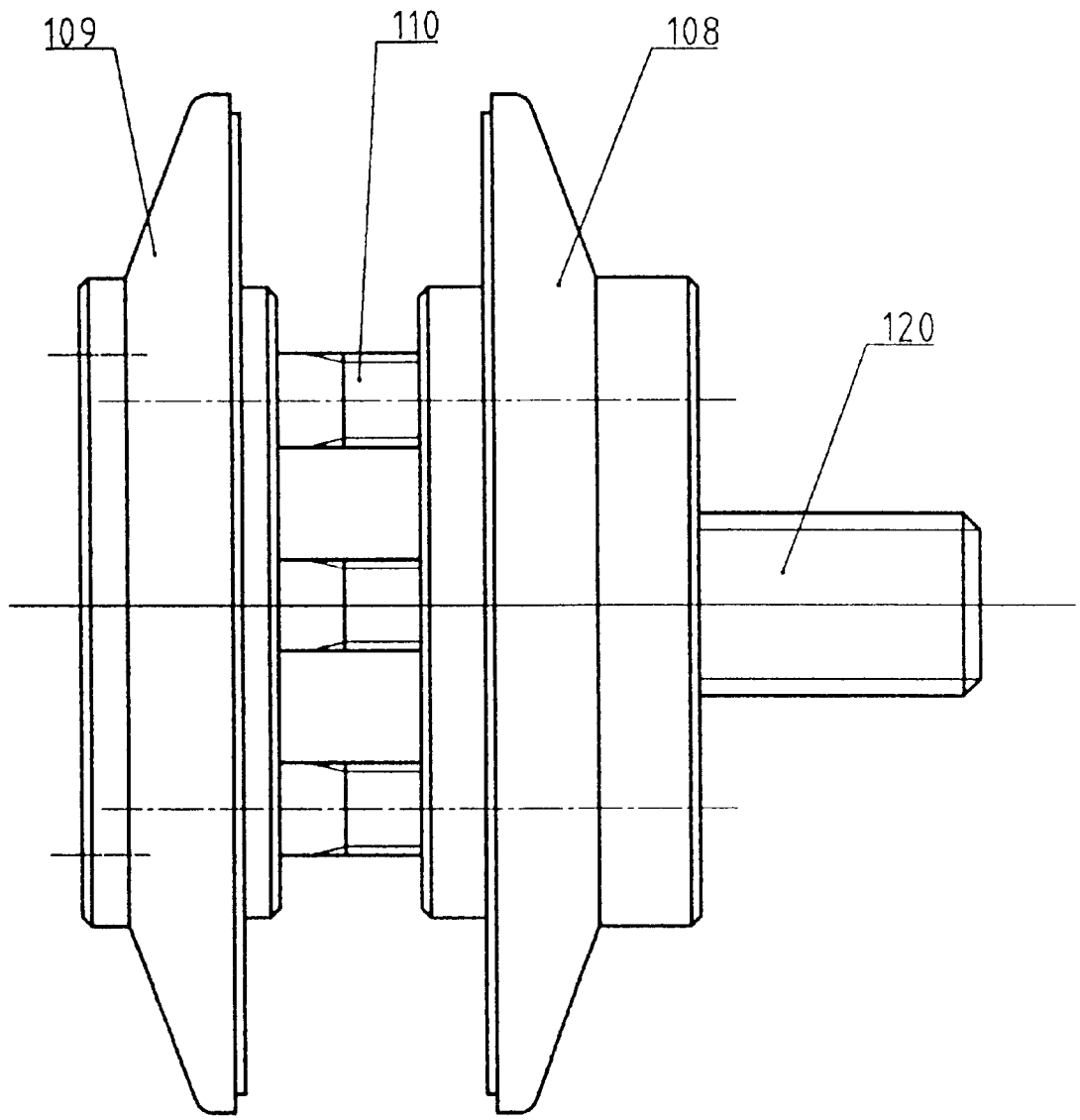
FIGS. 14 to 22 diagrammatically represent the current conduction, not showing the stress-free adaptation of the attachment device.
Figure 15:
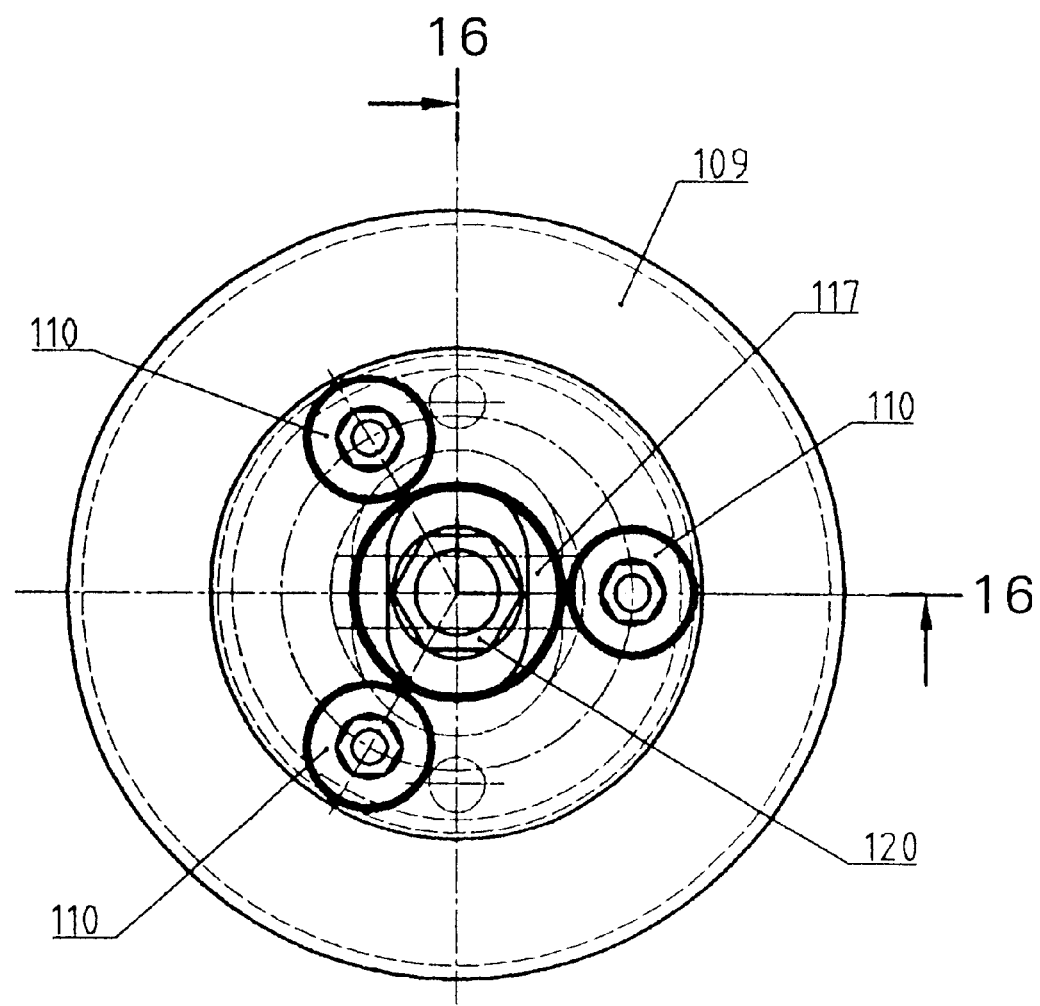

The glass pane 101 comes with several hole-type apertures 106 in which area the attachment device 107 is positioned. The attachment device 107 includes an interior holding disc 108 oriented towards the glass pane and an opposite exterior holding disc 109. In the embodiment example, three separate bolts 110 screw the holding discs 108,109 together, as shown in FIGS. 14 and 15. The bolts 110 are hold in female threads 111 in the holding disc 108 and extend through holes 112 in the holding disc 109.

Both holding discs 108, 109 are provided with cylindrical extensions 113, 114 which extend into the glass pane's 101 aperture 106 and in which area the bolts 110 are arranged. Separate washers 115, for example made from rubber or plastic material, are inserted between the glass pane 101 and the holding discs 108, 109.

Figure 18:
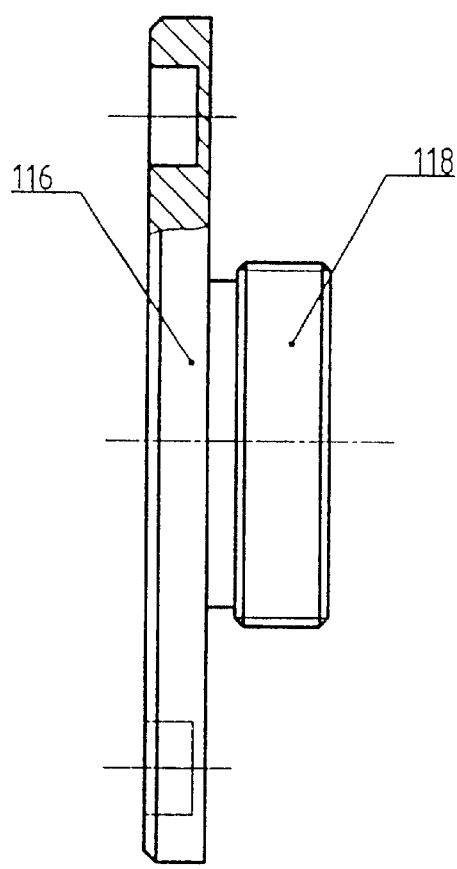

The exterior holding disc 109 has got an opening 117 in its center. The opening 117 is equipped with a female thread into which engages a counter-thread of a bolt-type projection 118 conformed to the cover cap 116, as shown in FIG. 18.

During the installation of the glass pane 101, both holding discs 108, 109 are fixed and mounted together with the glass pane 101 by means of an attachment bolt 120 to framework or the like. Subsequently, the couplings 125 connect metal strands 105 and cables 124, which together with the wires form the current conduction. The couplings 125 are preferably executed as plug connectors. Nevertheless it may also be a welded connection.

Figure 16:
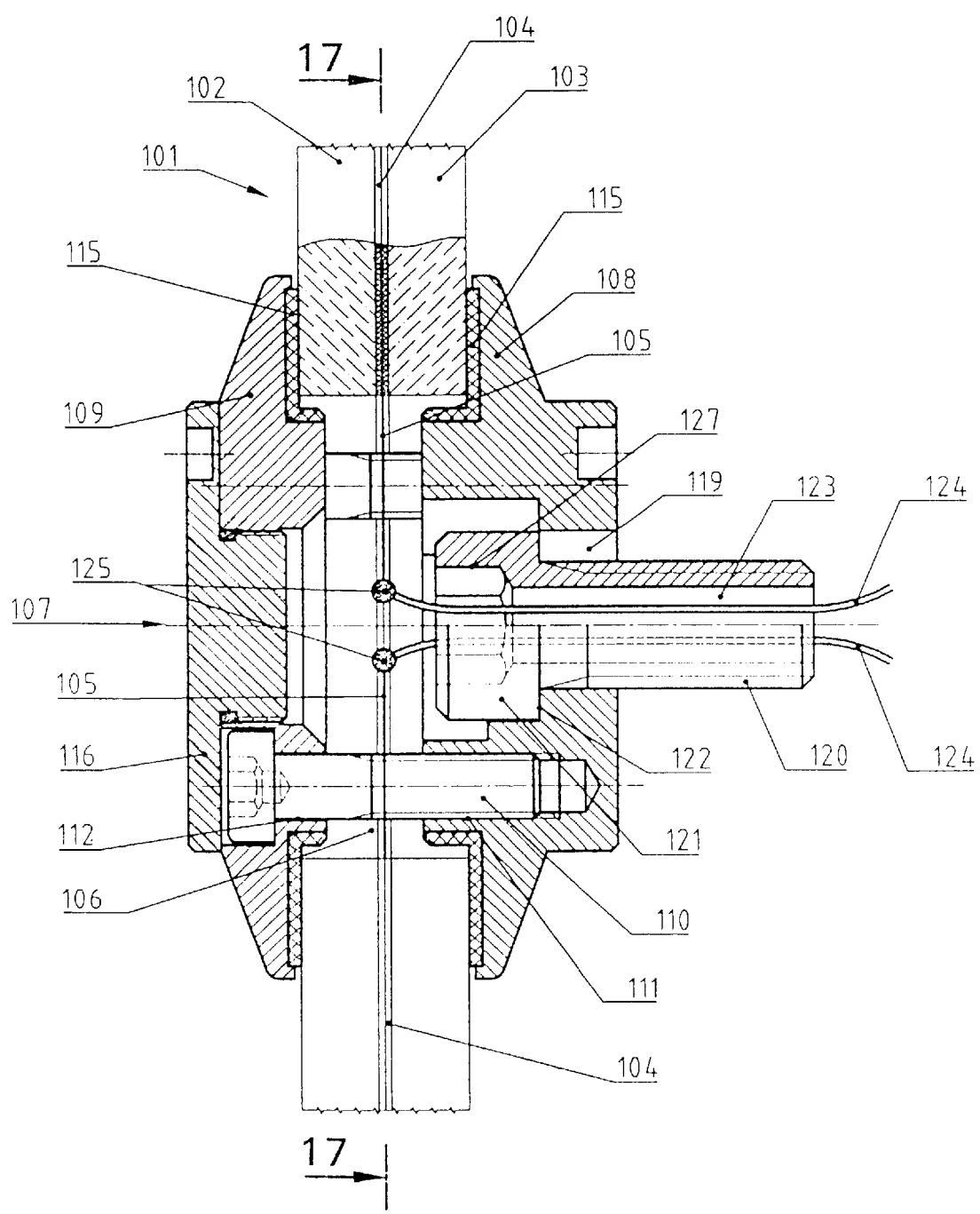
Figure 17:
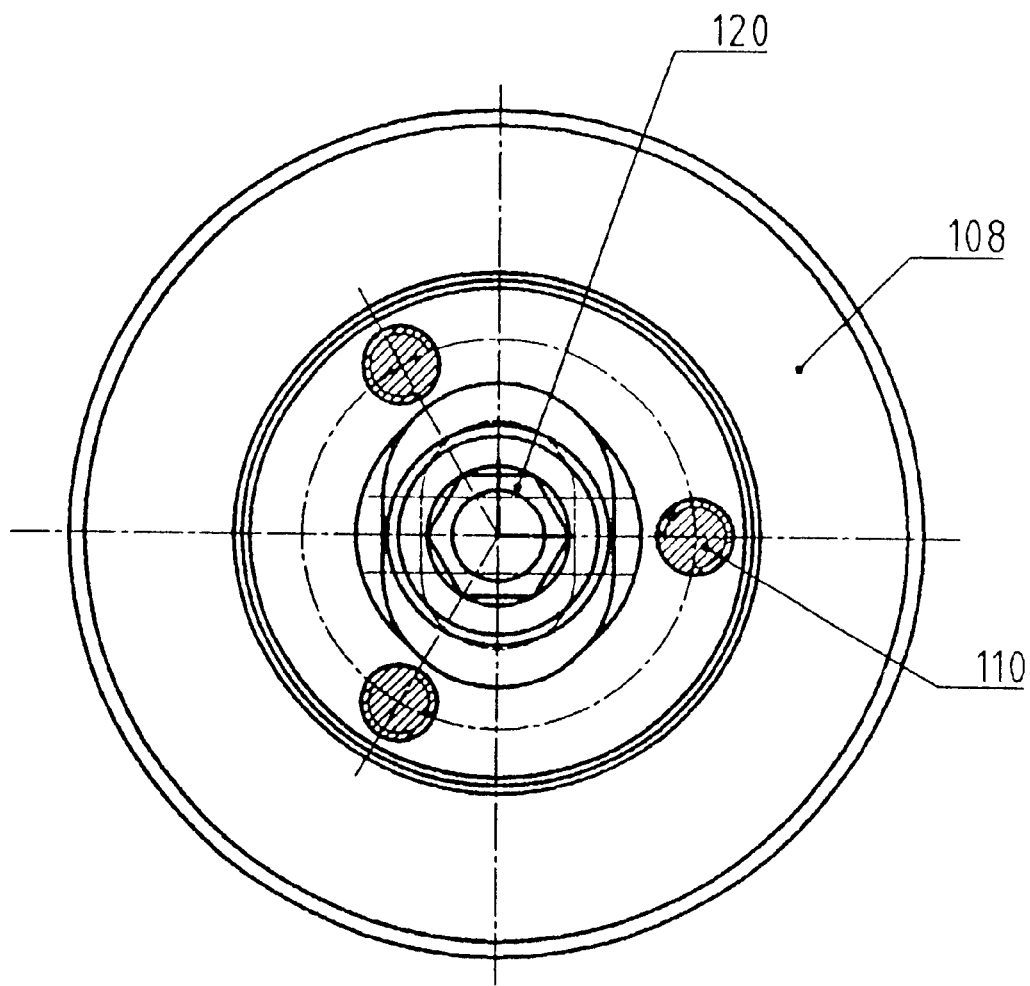

In the embodiment example according to FIGS. 16 and 17, there is an interior holding disc 108 that is oriented towards the structure and provided with an oblong hole through which extends the attachment bolt 120. The attachment bolt 120 shows a head piece 121 leaning on a holding face 122 of the holding disc 108 and retaining the latter in clamping manner. A hexagon socket 127 or the like is formed in the head piece 121 by which the attachment bolt 120 is screwed. With regard to the attachment bolt 120, the holding disc 108 is displaceable over the oblong hole's 119 length, thus compensating assembly tolerances.

Figure 19:
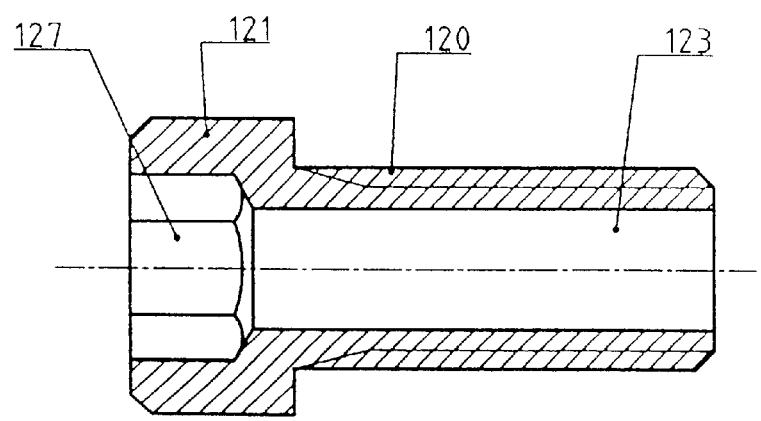

The attachment bolt 120 is conceived as a hollow cylinder and with an axial continuous opening 123 (see FIG. 19), through which extend the cables 124 connected inside the aperture 106 via couplings 125 to the wires 105 and which built together with the latter the wires conducting the current from the voltaic cells 104. In the execution example according to FIG. 20 an attachment bolt 120 is screwed into a female thread 126 in the holding disc 108. The attachment bolt 120 in this embodiment displays at the rear end a hexagon socket 127 or the like, allowing to engage a hexagon socket screw key.

To avoid oxidation of the wires built by metal strands and the cables 124 conducting the current in the area of the couplings 125, the apertures 106 are preferably filled in with a material of low electrical conductivity, for example wax or a synthetic material, like polyurethane.

The wires conducting the current radially enter the attachment fittings 107 between the holding discs 108, 109 and axially exit through the interior holding disc 108 and the attachment bolt 120. For this reason, there are no optical unpleasant connections; furthermore the connectors are protected against damage.

Figure 25:
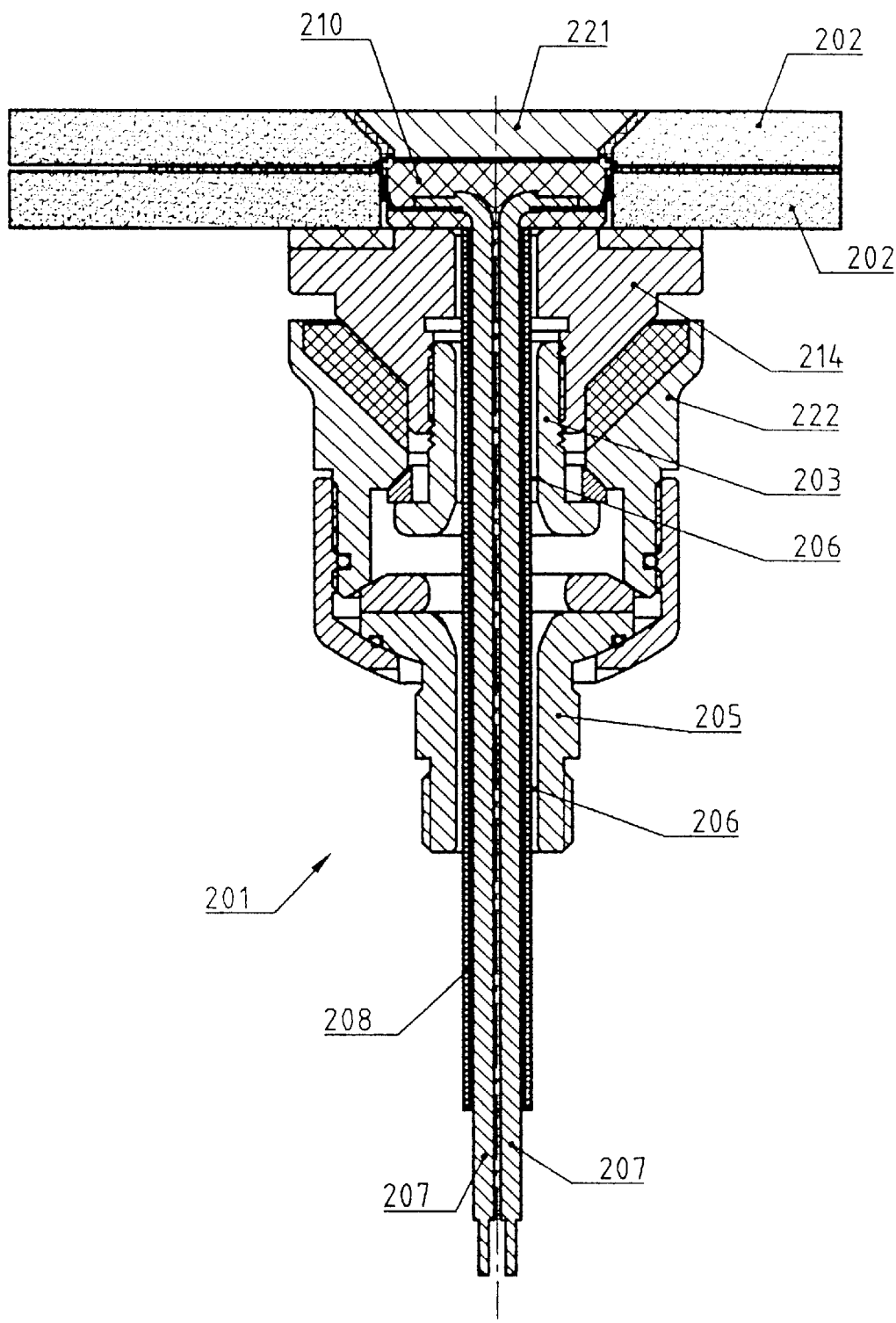
Figure 31:
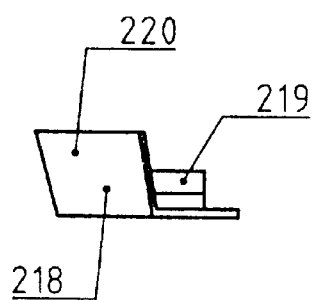
Figure 32:
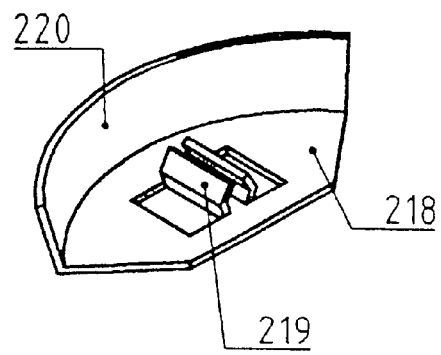
Figure 30:
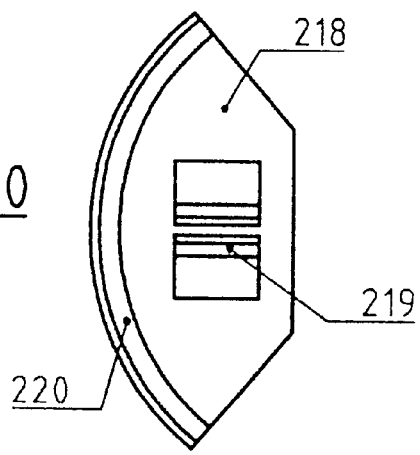
Figure 37:
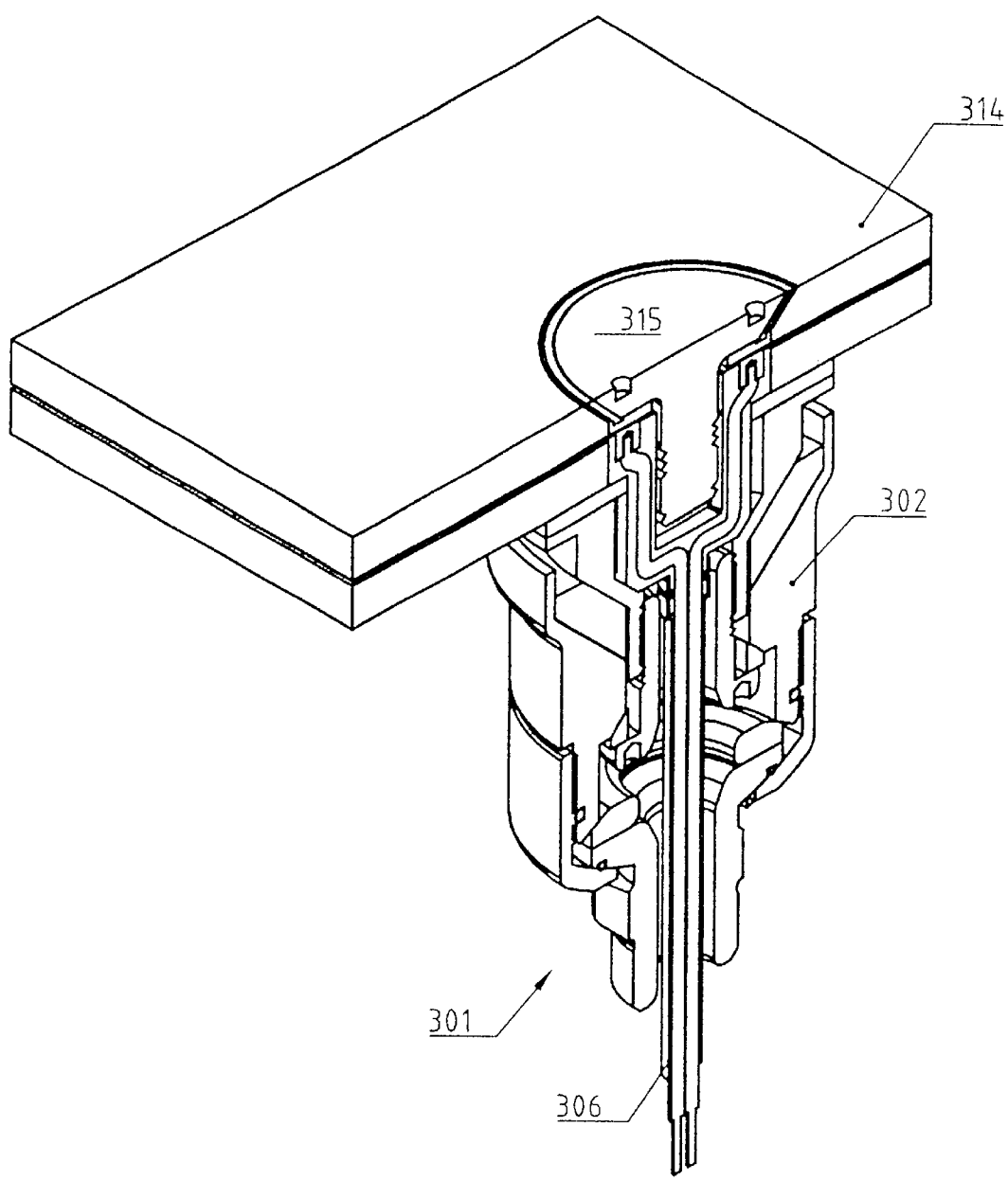

In the embodiment example according to FIGS. 23 to 36, an attachment device 201 clamping a glass pane 202 exhibits a coupling bell regulating screw 203 provided with a through borehole 206 with centering. In the same way, a floating screw 205 presents a through borehole 206. The coupling bell regulating screw fastens, likewise described in FIG. 1, a clamping element 214 inside the structure with a coupling bell 222. The through borehole 206 with centering is penetrated for example by a shrinkdown tubing 208 or insulating tube, which in focal plan in the upper part (cf. FIG. 25) connects to an insulator 210. The wires 207 passing through the shrinkdown tubing 208 lead as far as into the insulator 210 and are at this place connected via clips 219 at the contact pieces 218 to the wires 211 of the voltaic cells 212. The insulator 210 is arranged in a hole-type aperture 209 in the glass pane 202, fastened by means of clamp screws 215 extending through the through boreholes 213 in the insulator 210 and into the clamping element 214 inside the structure, and is positioned between the clamping element 214 and a cone nut 221. The insulator 210 itself displays radial slot openings 216 and axial guiding channels 217, whereby contact pieces 218 are arranged in the radial slot openings 216 which pieces' legs 220 touch and thus contact the wires 211 of the voltaic cells 212.

Figure 38:
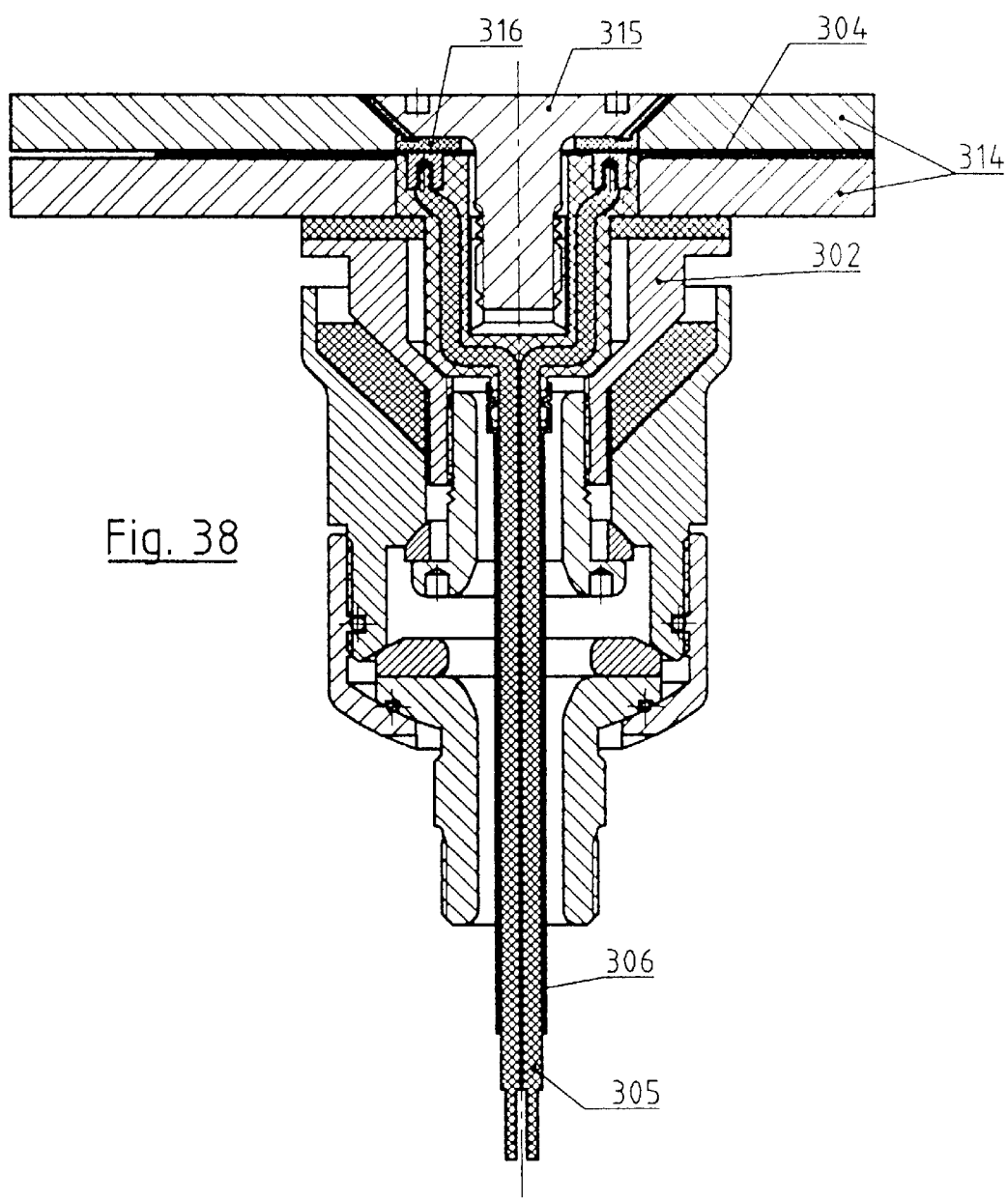
Figure 43:
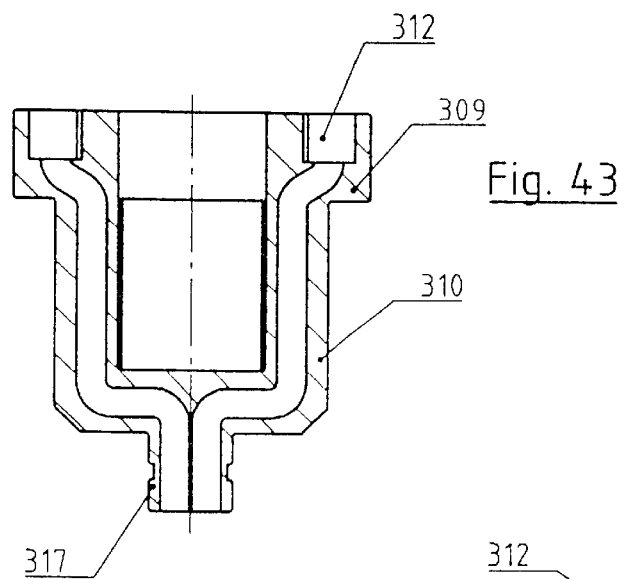
Figure 44:
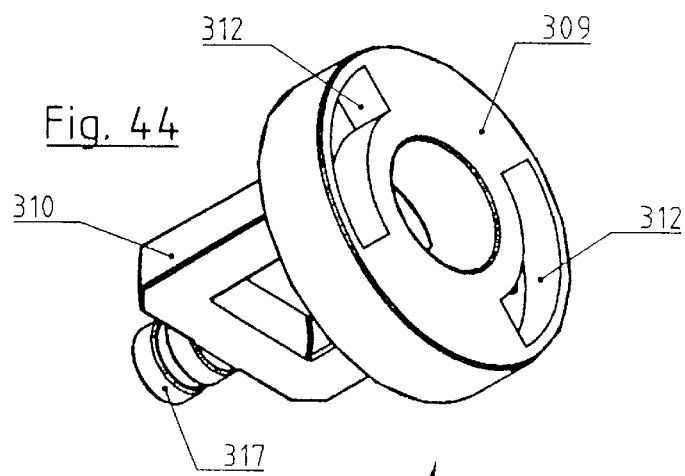
Figure 42:
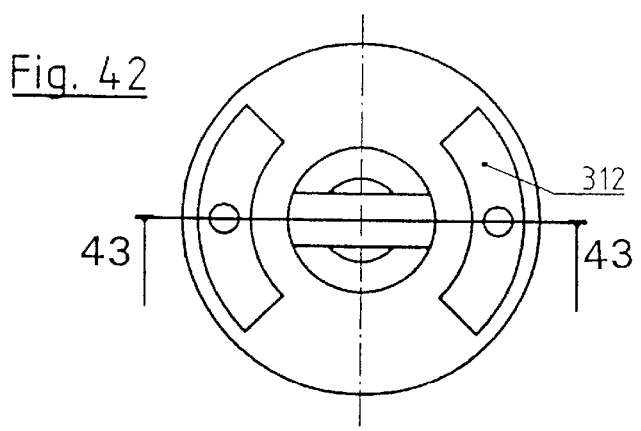
Figure 50:
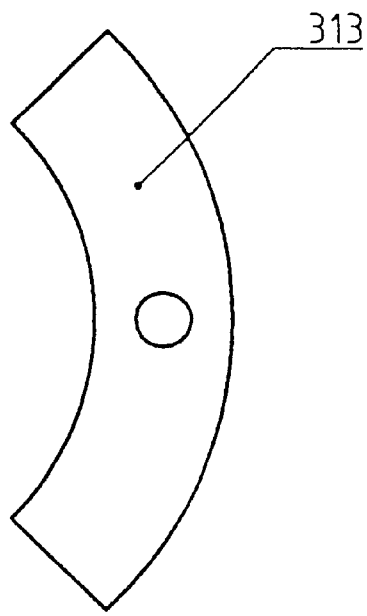
Figure 52:
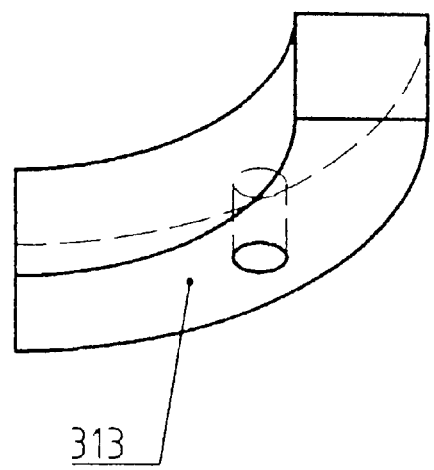
Figure 51:
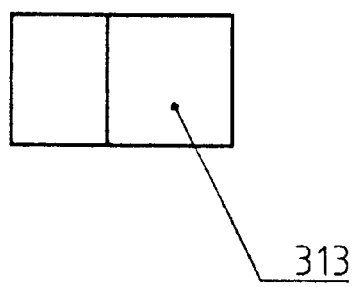

In the execution example according to FIGS. 37 to 53, an attachment device 301 clamping a glass pane 314 presents a clamping element 302 inside the structure, which is executed with an axial opening 303 into which a clamp screw 315 centrally engages by means of a thread 318. The axial opening has a slot-type form and serves to torsion resistingly receive a fork-like section 310 of the insulating cage 307, which is positioned with its annular section 309 that protrudes over the clamping element 302 to the exterior, in an aperture 308 of the glass pane 314. The insulating cage has got grooves 312 oriented towards the wires 311 of the voltaic cells 304 in which grooves —preferably spring loaded—are positioned annular contact pieces 313 establishing the electric contact between the wires 311 of the voltaic cells 304 and the wires 305 of the shrinkdown tubing 306. The annular contact pieces 313 are shown in detail in FIGS. 50 to 52. An insulating ring 316 is intended between the clamp screw 315 and the contact pieces 313 respectively the wires 311 of the voltaic cells 304. The positioning of the insulating ring 316 is shown in FIGS. 38 and 53. Via a tenon-like extension 317 of the insulating cage 307, the shrinkdown tubing 306 is detachably linked to the latter.

The above described attachment device 301 is thus suitable to maintain the glass panes' 2, 314 elasticity, as it does not impede their freedom of motion and thus neutralizes forces. The inventional attachment device means adaptation to the structural facts and thus not rigidity of the material glass, which forcibly leads to its destruction, as it is the case in the known art. In other words, the present invention avoids the destruction of glass which could occur with prior attachment devices by allowing adaptation to existing conditions, rather than holding the glass rigidly. Furthermore the optimum conduction of generated power without requiring separate ductwork is made possible.

For any application of punctiform suspended glass panes, whether inside or outside, whether with or without voltaic cells, the attachment device is suitable for stress-free assembly and also for stress-free permanent operation.

One feature of the invention resides broadly in the attachment device for a glass pane, including at least one unifacial voltaic cell with wires conducting the current, at a mounting fixed to a structure with one outside and one inside clamping element fastening the glass pane between them and a support of the attachment device at the inside clamping element, characterized in that the inside clamping element 5, on its envelope surface 6 opposite to the glass pane 2, 101, 202, 314, presents a conical or crowned surface (envelope surface 6) built by a permanently elastic spring member 7 against which surface a coupling bell 10 interior envelope's 9 complement surface 8 is adjustable with adaptable initial tension in a way that between the coupling bell 10 and an attachment bolt 11 and the attachment bolt 11 and the mounting 3 respectively one stiffening spatial articulation 12, 13 is realized and that the wires conducting the current pass through the attachment device 1, 107, 201, 301.

Another feature of the invention resides broadly in the attachment device characterized in that the inside clamping element 5 presents on its envelope surface 14 opposite to the glass pane 2 a conical or crowned surface (envelope surface 14).

Yet another feature of the invention resides broadly in the attachment device characterized in that the inside clamping element 5 presents a through borehole 16 with centering and female thread 15 for the reception of a clamp screw 17 connecting the clamping elements 4, 5 and a coupling bell regulating screw IS uniting the coupling bell 10 with the inside clamping element 5.

Still another feature of the invention resides broadly in the attachment device characterized in that a permanently elastic cushion 19 is placed between the interior clamping element's 5 conical or crowned surface opposite to the glass pane 2 and the coupling bell's 10 complement surface 8.

A further feature of the invention resides broadly in the attachment device characterized in that the coupling bell 10 on its side oriented towards the mounting 3 presents a cylindrical extension 21 with exterior thread 20 between said extension and the coupling bell 10 in the area of the coupling bell's 10 bottom 22 is conformed an inward oriented flange 23 to support the screw head 24 of the coupling bell regulating screw 18.

Another feature of the invention resides broadly in the attachment device characterized in that a play 26 is designed between the coupling bell regulating screw's flange 23 and a shaft 25.

Yet another feature of the invention resides broadly in the attachment device characterized in that a disc (lens) 27 is arranged between the flange 23 and the coupling bell regulating screw's 18 screw head 24.

Still another feature of the invention resides broadly in the attachment device characterized in that a locating face 28 of the flange 23 and a complement surface 29 of the disc (lens) 27 describes a conical or crowned form.

A further feature of the invention resides broadly in the attachment device characterized in that a fore-part 30 of the coupling bell's 10 extension 21 is oriented towards the mounting 3 and curved concave lens-shaped.

Another feature of the invention resides broadly in the attachment device characterized in that a pot-like union nut 31 overlapping the exterior thread 20 of the coupling bell's 10 extension 21, which union-nut's inner pot bottom area 32 displays a curvature opposite with regard to the fore-part 30 of the coupling bell's 10 extension 21.

Yet another feature of the invention resides broadly in the attachment device characterized in that between the fore-part 30 of the coupling bell's 10 extension 21 and the union nut's 31 pot bottom area 32 are arranged two planoconvex lenses 34, 35 abutting with their flat surfaces 33.

Still another feature of the invention resides broadly in the attachment device characterized in that the planoconvex lens 35 abutting against the union nut's 31 pot bottom area 32 forms one component of a nut 36 receiving the attachment bolt 11.

A further feature of the invention resides broadly in the attachment device characterized in that a shaft 37 of the nut 36 extends with play through a borehole 38 in the pot bottom 39 of the union nut 31.

Another feature of the invention resides broadly in the attachment device characterized in that the attachment bolt 11 extends with a play 42 through a borehole 41 in the mounting 3 and the mounting 3 is positioned between a nut 43 and a counter nut 44, whereby on the one hand between the nut 43 respectively the counter nut 44 and on the other hand the mounting 3, in each case is provided one planoconvex lens 46, 47 abutting with its flat surface 45 against the mounting and the nut 43 and the counter nut 44 are designed to present a complement locating face 48 with regard to the lens 46, 47.

Yet another feature of the invention resides broadly in the attachment device characterized in that a distance sleeve 49 is arranged between the nut 36 receiving the attachment bolt 11 and the nut 43 retaining the mounting 3.

Still another feature of the invention resides broadly in the attachment device characterized in that the outside clamping element 4 is designed as clamping disc.

A further feature of the invention resides broadly in the attachment device characterized in that the outside clamping element 4 is designed as countersunk screw.

Another feature of the invention resides broadly in the attachment device characterized in that the current conducting wires of at least one voltaic cell 104 extend through the attachment device 107, 201, 301.

Yet another feature of the invention resides broadly in the attachment device characterized in that the sheet voltaic cell 104 is or several sheet voltaic cells 104 are inserted between two individual panes 102, 103 of the glass pane 101. Still another feature of the invention resides broadly in the attachment device characterized in that the attachment device 107 includes two holding discs 108, 109 that can be coupled preferably screwed, fixing between them the glass pane 101, whereby the wires conducting the current radially enter between the holding discs 108, 109 and axially exit at one of the holding discs 108.

A further feature of the invention resides broadly in the attachment device characterized in that each holding disc 108, 109 presents a cylindrical extension 113, 114 stretching out into an aperture 106 of the glass pane 101.

Another feature of the invention resides broadly in the attachment device characterized in that the holding discs 108, 109 are screwed by means of separate bolts 110 which are preferably arranged in the area of the cylindrical extension 113, 114.

Yet another feature of the invention resides broadly in the attachment device characterized in that the wires conducting the current present couplings 125 in the area of the holding discs 108,109.

Still another feature of the invention resides broadly in the attachment device characterized in that the wires conducting the current from the voltaic cells 104 inside the glass pane 101 are made of flat metal strands 105 which are connected by means of couplings 125 to cables 124 round wires respectively standard wires. In other words, the flat metal strands 105 are connected to the round standard wires of cables 124 by couplings 125. Screw 203 and a floating screw 205, that is fastened by a union nut 204 and can be connected to the attachment bolt, presents a through borehole 206 with centering for the reception of a flexible tubing (shrinkdown tubing 208) with a sheathed flexible cable 207 conducting the current.

A further feature of the invention resides broadly in the attachment device characterized in that the couplings 125 are executed as connectors.

Another feature of the invention resides broadly in the attachment device characterized in that one of the holding discs 108 is retained by an attachment bolt 120 executed as hollow cylinder and through which pass the cables 124 of the wires conducting the current from the voltaic cells 104.

Yet another feature of the invention resides broadly in the attachment device characterized in that the attachment bolt 120 holds the holding disc 108 in a clamping manner.

Still another feature of the invention resides broadly in the attachment device characterized in that the attachment bolt 120 extends through an oblong hole 119 of the holding disc 108.

A further feature of the invention resides broadly in the attachment device characterized in that one of the holding discs 109 presents an axial opening 117 covered by a cap 116.

Another feature of the invention resides broadly in the attachment device characterized in that the opening 117 is equipped with a female thread into which a bolt-like projection 118 of the cap 116 is screwable.

Yet another feature of the invention resides broadly in the attachment device characterized in that the aperture 106 is filled in with an insulating synthetic material, wax or the like and the wires are embedded into this material.

Still another feature of the invention resides broadly in the attachment device characterized in that polyurethane is used as synthetic material.

A further feature of the invention resides broadly in the attachment device characterized in that the attachment bolt 120 is designed with a hexagon socket 127.

Another feature of the invention resides broadly in the attachment device characterized in that a coupling bell regulating the torsion resistant reception of an insulating cage 307 serving to establish the electrical connection of voltaic cells 304 with the wires 305 of a flexible tubing (shrinkdown tubing 306) extending through the clamping element 302 inside the structure.

Yet another feature of the invention resides broadly in the attachment device characterized in that an insulator 210 is arranged in a glass pane's 202 hole-type aperture 209 and that the wires 211 of the voltaic cells 212 are connected to the sheathed flexible cables 207 inside the insulator 210.

Still another feature of the invention resides broadly in the attachment device characterized in that the insulator 210 is provided with two through boreholes 213 for the penetration of the clamp screws 215 fastening the glass pane 202 with a clamping element 214 inside the structure.

A further feature of the invention resides broadly in the attachment device characterized in that the insulator 210 presents at least two radial slot openings 216 and axial guiding channels 217 are connected to the respective radial slot opening 216 for the reception of the electrical wires 207, 211.

Another feature of the invention resides broadly in the attachment device characterized in that springy elastic current collectors (contact piece 218) are installed in the radial slot openings 216.

Another feature of the invention resides broadly in the attachment device characterized in that the insulator 210 can be fastened between the clamping element 214 inside the structure and a cone nut 221 fixing the glass pane 202.

Yet another feature of the invention resides broadly in the attachment device characterized in that a clamping element 302 inside the structure presents an axial opening 303 for the torsion resistant reception of an insulating cage 307 serving to establish the electrical connection of voltaic cells 304 with the wires 305 of a flexible tubing (shrinkdown tubing 306) extending through the clamping element 302 inside the structure.

Still another feature of the invention resides broadly in the attachment device characterized in that the insulating cage 307 consists of an annular section 309 retained in a glass pane's 314 hole-like aperture 308 and of a fork-like section 310 retained in the clamping element 302 inside the structure.

A further feature of the invention resides broadly in the attachment device characterized in that grooves 312, open towards the wires 311 of the voltaic cells 304, are arranged in the annular section 309 of the insulating cage 307.

Another feature of the invention resides broadly in the attachment device characterized in that contact pieces 313 are arranged in the grooves 312 adjoining the voltaic cell's 304 wires 311 and connecting with the wires 305 of the flexible tubing (shrinkdown tubing 306).

Yet another feature of the invention resides broadly in the attachment device characterized in that the contact pieces 313 are spring loaded against the wires 311 of the voltaic cells 304.

Still another feature of the invention resides broadly in the attachment device characterized in that the glass pane 314 is fastened between a clamp screw 315 outside the structure and the clamping element 302 inside the structure and an insulating ring 316 is arranged between the clamp screw 315 and the contact pieces 313.

A further feature of the invention resides broadly in the attachment device characterized in that the flexible tubing (shrinkdown tubing 306) clips on a tenon-like extension 317 of the insulating cage's 307 fork-like section 310.

The following U.S. Patent are hereby incorporated by reference as if set forth in their entirety herein: U.S. Pat No. 6,158,177, filed on Nov 25, 1998, having attorney docket no. NHL-OR-48 and having inventor Ernst Udo Blobaum; U.S. Pat No. 6,131,346, filed on May 14, 1999, having attorney docket no. NHL-DOR-54 and having inventor Herbert Kordes; No. 6,119,415, filed on Sep. 29, 1998, having attorney docket no. NHL-RBB-04 and having inventors Manfred Rinklake and Norbert Rosler; U.S. Pat. No. 6,182, 404, filed on Sep. 29, 1998, having attorney docket no. NHL-RBB-05 and having inventors Manfred Rinklake and Norbert Rosler; U.S. Pat. No. 6,105,331, filed on Sep. 29, 1998, having attorney docket no. NHL-RBB-06 and having inventors Manfred Rinklake and Norbert Rosler.

Some examples of glass mountings or glass mounting devices which may possibly be utilized or adapted for use in the context of the present invention may be found in the following U.S. Patents and U.S. Patent Applications: U.S. Pat. No. 5,323,577, issued on Jun. 28, 1994 to Whitmyer; U.S. Pat. No. 5,283,978, issued on Feb. 8, 1994 to Horgan, Jr.; U.S. Pat. No. 5,212,922, issued on May 25, 1993 to Werner; U.S. Pat. No. 4,841,697, issued on Jun. 27, 1989 to Hogg, et al.; U.S. Pat. No. 4,097,320, issued on Jun. 27, 1978 to Brauer et al.; U.S. Pat. No. 4,054,268, issued on Oct. 18, 1977 to Sher; U.S. Pat. No. 4,016,690, issued on Apr. 12, 1997 to Richardson; and Serial No. 09/200,459, filed on Nov. 25, 1998 by applicant Blobaum.

Some examples of glass facades and methods of securing glass panels of a facade which may possibly be utilized or adapted for use in the context of the present invention may be found in the following U.S. Patents: U.S. Pat. No. 5,791,105, issued on Aug. 11, 1998 to Gangi; U.S. Pat. No. 5,524,404, issued on Jun. 11, 1996 to Lahaye; U.S. Pat. No. 5,493,831, issued on Feb. 27, 1996 to Jansson; U.S. Pat. No. 5,373,672, issued on Dec. 20, 1994 to Schulz; U.S. Pat. No. 5,301,484, issued on Apr. 12, 1994 to Jansson; U.S. Pat. No. 5,184,440, issued on Feb. 9, 1993 to Felix, et al.; U.S. Pat. No. 5,069,014, issued on Dec. 3, 1991 to Kubbutat; U.S. Pat. No. 4,837,996, issued on Jun. 13, 1989 to Eckelt; and U.S. Pat. No. 4,793,112, issued on Dec. 27, 1988 to Sufke.

The components disclosed in the various publications, disclosed or incorporated by reference herein, may be used in the embodiments of the present invention, as well as, equivalents thereof.

The appended drawings in their entirety, including all dimensions, proportions and/or shapes in at least one embodiment of the invention, are accurate and to scale and are hereby included by reference into this specification.

All, or substantially all, of the components and methods of the various embodiments may be used with at least one embodiment or all of the embodiments, if more than one embodiment is described herein.

All of the patents, patent applications and publications recited herein, and in the Declaration attached hereto, are hereby incorporated by reference as if set forth in their entirety herein.

The corresponding foreign and international patent publication applications, namely, Federal Republic of Germany Patent Application No. 199 15 193.8, filed on Apr. 6, 1999, having inventor Hubert Elmer, AT-OS 954/98 filed Jun. 4, 1998 and AT-PS and DE-OS 199 15 193.8 and DE-PS 199 15 193.8 and PCT/EP99/03721 filed May 28, 1999, as well as their published equivalents, and other equivalents or corresponding applications, if any, in corresponding cases in the Federal Republic of Germany and elsewhere, and the references cited in any of the documents cited herein, are hereby incorporated by reference as if set forth in their entirety herein.

The details in the patents, patent applications and publications may be considered to be incorporable, at applicant's option, into the claims during prosecution as further limitations in the claims to patentably distinguish any amended claims from any applied prior art.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clause are intended to cover the structures described herein as performing the recited function and not only structural equivalents but also equivalent structures.

The invention as described herein above in the context of the preferred embodiments is not to be taken as limited to all of the provided details thereof, since modifications and variations thereof may be made without departing from the spirit and scope of the invention.

At Least Partial List of References:
1. attachment device
2. glass pane
3. mounting fixed at the structure
4. clamping element
5. clamping element
6. envelope surface
7. permanently elastic spring member
8. complement surface
9. inner envelope
10. coupling bell
11. attachment bolt
12. spatial articulation
13. spatial articulation
14. envelope surface
15. female thread
16. through borehole
17. clamp screw
18. coupling bell regulating screw
19. permanently elastic cushion
20. exterior thread
21. cylindrical extension
22. bottom
23. flange
24. screw head
25. shaft
26. play
27. lens
28. locating face
29. complement surface
30. fore-part
31. union nut
32. internal pot bottom area
33. flat surface
34. lens
35. lens
36. nut
37. shaft
38. borehole
39. pot bottom
40. play
41. borehole
42. play
43. nut
44. counter nut
45. flat surface
46. lens
47. lens
48. complement locating face
49. distance sleeve
50. female thread
51. pocket borehole
52. wrench areas
53. projection
101. glass pane
102. individual pane
103. individual pane
104. voltaic cells
105. metal strands
106. hole-type aperture
107. attachment device
108. holding disc
109. holding disc
110. bolts 111. female thread
112. borehole
113. cylindrical extension
114. cylindrical extension
115. seal
116. cover cap
117. opening
118. projection
119. oblong hole
120. attachment bolt
121. head piece
122. holding surface
123. opening
124. cable
125. coupling
126. female thread
127. hexagon socket
201. attachment device
202. glass pane
203. coupling bell regulating screw
204. union nut
205. floating screw
206. through borehole with centering
207. wire (sheathed flexible cable)
208. shrinkdown tubing
209. hole-type aperture
210. insulator
211. wire
212. voltaic cells
213. through boreholes
214. clamping element inside the structure
215. clamp screw
216. radial slot opening
217. axial guiding channel
218. contact piece
219. clips
220. leg
221. cone nut
222. coupling bell
301. attachment device
302. clamping element inside the structure
303. axial opening
304. voltaic cells
305. wires of the shrinkdown tubing
306. shrinkdown tubing
307. insulating cage
308. aperture
309. annular section
310. fork-like section
311. wire
312. grooves
313. contact pieces
314. glass pane
315. clamp screw
316. insulation
317. tenon-like extension
318. thread

What is claimed is:

1. An attachment device for mounting to a structure a glass pane which contains at least one voltaic cell equipped with wires, comprising:
a first clamping element configured to clamp a first side of said glass pane;
a second clamping element having a first surface configured to clamp a second side of said glass pane opposite said first clamping device;
said second clamping element having a second surface opposite said first surface;
a conical elastic spring member having an inside surface and an outside surface;
said conical elastic spring member being disposed against said second surface of said second clamping element such that said outside surface of said conical elastic spring member is orientated away from said second clamping element;
a coupling bell having an inner surface;
said inner surface of said coupling bell being disposed adjoining said outer surface of said conical elastic spring member;
an attachment bolt having a first end portion and a second end portion;
a first stiffenable articulation connecting said first end portion of said attachment bolt to said coupling bell;
a second stiffenable articulation adapted and configured to connect said second end portion of said attachment bolt to said structure; and
an electrical connection to conduct electric current from said wires of said at least one voltaic cell through said attachment device.

2. The attachment device according to claim 1, wherein said second surface of said second clamping element is conical.

3. The attachment device according to claim 1, wherein:
said second clamping element is provided with a borehole therethrough, said borehole having screw threads therein comprising a first portion and a second portion;
a clamp screw engages said first portion of said screw threads of said borehole and connects said second clamping element to said first clamping element; and
a coupling bell regulating screw comprises a first end portion and a second end portion;
said first end portion of said coupling bell regulating screw comprises a threaded portion;
said first end portion of said coupling bell regulating screw engages said second portion of said screw threads of said borehole; and
said second end portion of said coupling bell regulating screw extends into said coupling bell and is capable of leaning thereon.

4. The attachment device according to claim 1, wherein said conical elastic spring member comprises an elastic cushion.

5. The attachment device according to claim 1, further comprising:
a first holding disc and a second holding disc;
said first holding disc having an axis and a first side adapted to contact a first side of said glass pane;
said second holding disc having an axis and a first side adapted to contact a second side of said glass pane and an axial opening adapted to permit at least one wire to pass therethrough; and
means for mechanically coupling said first holding disc to said second holding disc when said first side of said glass pane is in contact with said first holding disc and said second side of said glass pane is in contact with said first side of said second holding disc.

6. The attachment device according to claim 1, wherein:
said first surface of said second clamping element comprises an axial slot structure;
said electrical connection to conduct electric current from said wires of said at least one voltaic cell through said attachment device comprises an insulating cage having wires running therethrough;

said insulating case comprising an annular section and a fork-like section;

said fork-like section being disposed in said slot structure;

said annular section having at least one groove therein open toward said at least one wire attached to said voltaic cell;

at least one contact piece is disposed in said groove;

said contact piece is electrically connected to at least one of said wires running through said insulating cage; and said contact piece is adapted to electrically connect to at least one of said wires of said voltaic cell.

7. The attachment device according to claim 6, wherein said at least one contact piece is spring loaded in order to mechanically connect said contact piece to said at least one wire of said voltaic cell.

8. The attachment device according to claim 1, wherein:

said second clamping element is provided with a borehole therethrough, said borehole having screw threads therein;

a coupling bell regulating screw comprises a first end portion and a second end portion;

said first end portion of said coupling bell retaining screw comprising a threaded portion;

a head is located on said second end portion of said coupling bell retaining screw;

said coupling bell comprises a conical body and a cylindrical extension extending away from said second clamping element;

said coupling bell further comprises a flange within said cylindrical extension adjacent to said conical body;

said first end portion of said coupling bell regulating screw engages said screw threads of said borehole;

said second end portion of said coupling bell retaining screw and said flange are configured such that said head on said second end portion of said coupling bell retaining screw leans upon said flange; and said flange and said second end portion of said coupling bell retaining screw are configured so as to permit play between said flange and said second end portion of said coupling bell retaining screw.

9. The attachment device according to claim 8, further comprising an elastic disc located between said flange and said head on said second end portion of said coupling bell retaining screw.

10. The attachment device according to claim 8, wherein:

said flange comprises a locating face;

said disc comprises a complement face; and both said locating face and said complement face are crowned.

11. The attachment device according to claim 8, wherein:

said cylindrical extension further comprises an end portion distant from said flange and said conical body;

said end portion comprises a surface having a concave curvature; and said end portion of said cylindrical extension is orientated toward said second stiffenable articulation.

12. The attachment device according to claim 11, wherein said first stiffenable articulation comprises:

said cylindrical extension further comprising an outer surface having threads on at least a portion thereof;

a union nut engaging said threads on at least a portion of said outer surface of said cylindrical extension;

said union nut comprising an inner bottom area;

said inner bottom area of said union nut comprising a surface having a curvature opposite said concave curvature of said end portion of said cylindrical extension;

a first planoconvex lens having a first side which is substantially flat and a second side having a portion which is substantially convex;

a second planoconvex lens having a first side which is substantially flat and a second side which is substantially convex;

said first lens being located between said bottom area of said union nut and said end portion of said cylindrical extension of said coupling bell;

said first side of said second planoconvex lens abutting said first of said first planoconvex lens;

a nut comprising a first end portion and a second end portion;

said first end portion of said nut being connected to said first end portion of said attachment bolt; and said second end portion of said nut comprising said first planoconvex lens.

13. The attachment device according to claim 12, wherein:

said nut further comprises a shaft between said first end portion of said nut and said second end portion of said nut;

said bottom area of said union nut is provided with a hole therethrough;

said shaft between said first end portion of said nut and said second end portion of said nut extends with play through said hole through said bottom of said union nut.

14. The attachment device according to claim 13, wherein said second stiffenable articulation comprises:

a third planoconvex lens, comprising a first side which is substantially flat and a second side which is substantially convex, said third planoconvex lens having an axial hole therethrough, adapted to slidably engage said attachment bolt;

a fourth planoconvex lens, comprising a first side which is substantially flat and a second side which is substantially convex, said fourth planoconvex lens having an axial hole therethrough, adapted to slidably engage said attachment bolt;

said third planoconvex lens being slidably disposed on said attachment bolt with said first side of said third planoconvex lens facing away from said first end portion of said attachment bolt;

said fourth planoconvex lens being slidably disposed on said attachment bolt with said first side of said fourth planoconvex lens facing toward said first side of said third planoconvex lens and said second side of said fourth planoconvex lens facing away from said first end portion of said attachment bolt;

a first mounting nut having an end comprising a concave surface being disposed on said attachment bolt such that said concave surface of said first mounting nut is abutable to said first surface of said third planoconvex lens; and a second mounting nut having an end comprising a concave surface being disposed on said attachment bolt such that said concave surface of said second mounting nut is abutable to said first surface of said fourth planoconvex lens.

15. The attachment device according to claim 14, wherein a distance sleeve is disposed between said nut attached to said first end portion of said attachment bolt and said first mounting nut.

16. The attachment device according to claim 5, wherein:

said first holding disc further comprises a first cylindrical extension adapted to extend into an aperture in said glass pane;

said means for mechanically coupling said first holding disc to said second holding disc comprises a plurality of bolts extend through said first cylindrical extension and said second cylindrical extension; and said electrical connection to conduct electric current from said wires of said at least one voltaic cell through said attachment device comprises at least one electrical coupling located between said first side of said first holding disc and said first side of said second holding disc.

17. The attachment device according to claim 16, wherein:

said wires of said at least one voltaic cell comprise flat metal strands;

said at least one electrical coupling is adapted to make electrical contact with at least one of said flat metal strands;

said electrical connection to conduct electric current from said wires of at least one voltaic cell through said attachment device further comprises at least one round wire having a length and being connected to said at least one coupling; a flexible tubing having a length surrounds said at least one round wire over at least a portion of said length of said round wire;

said attachment bolt has a borehole therethrough adapted to permit the passage therethrough of a portion of said length of said flexible tubing.

18. The attachment disc according to claim 17, wherein:

said first holding disc is provided with a axial opening therein; and a cap covers said axial opening.

19. The attachment device according to claim 18, wherein:

said first holding disc comprises a threaded periphery to said axial opening in said first holding disc; and said cap comprises a threaded bolt-like projection which screwably engages aid threaded periphery.

20. A device comprising:

a glass pane comprising a first individual pane and a second individual pane and at least one voltaic cell having wires attached thereto;

said first individual pane comprising a first side and a second side;

said second individual pane comprising a first side and a second side;

said first side of said first individual pane being disposed substantially adjacent said first second side of said second individual pane;

said at least one voltaic cell being disposed between said first side of said first individual pane and said second side of said second individual pane;

a first clamping element configured to clamp a first side of said glass pane;

a second clamping element having a first surface configured to clamp a second side of said glass pane opposite said first clamping device;

said second clamping element having a second surface opposite said first surface;

a conical elastic spring member having an inside surface and an outside surface;

said conical elastic spring member being disposed against said second surface of said second clamping element such that said outside surface of said conical elastic spring member is orientated away from said second clamping element;

a coupling bell having an inner surface;

said inner surface of said coupling bell being disposed adjoining said outer surface of said conical elastic spring member;

an attachment bolt having a first end portion and a second end portion;

a first stiffenable articulation connecting said first end portion of said attachment bolt to said coupling bell;

a second stiffenable articulation adapted and configured to connect said second end portion of said attachment bolt to said structure; and an electrical connection to conduct electric current from said wires of said at least one voltaic cell through said attachment device.

* * * * *

UNITED STATES PATENT AND TRADEMARK OFFICE
CERTIFICATE OF CORRECTION

PATENT NO. : 6,254,397 B1
DATED : July 3, 2001
INVENTOR(S) : Hubert Elmer

It is certified that error appears in the above-identified patent and that said Letters Patent is hereby corrected as shown below:

Column 7,
Line 29, after 'projection', delete "531" and insert -- 53, --.

Column 11,
Line 28, after 'screw', delete "IS" and insert -- 18 --.

Column 21,
Line 44, after 'engages', delete "aid" and insert -- said --.

Signed and Sealed this

Eighth Day of October, 2002

Attest:

JAMES E. ROGAN
Attesting Officer    Director of the United States Patent and Trademark Office